(12) United States Patent
Tsukiyama et al.

(10) Patent No.: US 6,781,488 B2
(45) Date of Patent: Aug. 24, 2004

(54) CONNECTED CONSTRUCTION OF A HIGH-FREQUENCY PACKAGE AND A WIRING BOARD

(75) Inventors: Yoshio Tsukiyama, Toyonaka (JP); Masato Shiobara, Amagasaki (JP)

(73) Assignee: Sumitomo Metal (SMI) Electronics Devices Inc., Yamaguchi (JP)

( * ) Notice: Subject to any disclaimer, the term of this patent is extended or adjusted under 35 U.S.C. 154(b) by 49 days.

(21) Appl. No.: 10/105,448

(22) Filed: Mar. 26, 2002

(65) Prior Publication Data

US 2003/0030516 A1 Feb. 13, 2003

(30) Foreign Application Priority Data

Mar. 27, 2001 (JP) ........................................ 2001-089042

(51) Int. Cl.[7] ............................................... H01P 1/00
(52) U.S. Cl. ...................................... 333/247; 257/728
(58) Field of Search ................................ 333/247, 254; 257/728

(56) References Cited

U.S. PATENT DOCUMENTS 6,489,679 B2 * 12/2002 Tsukiyama et al. .......... 257/728

2002/0153977 A1 * 10/2002 McDonough et al. ....... 333/247

FOREIGN PATENT DOCUMENTS

JP 144509 A * 5/2001

* cited by examiner

*Primary Examiner*—Benny Lee
*Assistant Examiner*—Kimberly Glenn
(74) *Attorney, Agent, or Firm*—Wenderoth, Lind & Ponack, L.L.P.

(57) ABSTRACT

A connected construction of a high-frequency package and a wiring board have an excellent high-frequency transmission characteristic without degradation of the transmission characteristic of even high-frequency signals in a wide band ranging from 20 GHz to 80 GHz in the case of connecting a high-frequency package to a wiring board. A distance between conductive vias and conductive vias to connect grounds formed on both main surfaces of a high-frequency transmission line substrate constituting the high-frequency package, and a distance between conductive vias and conductive vias to connect grounds formed on both main surfaces of the wiring board on which the high-frequency package is mounted, are set in consideration of the dielectric constant of the high-frequency transmission line substrate and the dielectric constant of the wiring board in order to improve the high-frequency transmission characteristic between the high-frequency transmission line substrate and the wiring board.

7 Claims, 15 Drawing Sheets

CONNECTED CONSTRUCTION OF A HIGH-FREQUENCY PACKAGE AND A WIRING BOARD

BACKGROUND OF THE INVENTION

1. Field of the Invention

The present invention relates to a connected construction of a high-frequency package and a wiring board and, more particularly, to a connected construction of a high-frequency package and a wiring board wherein the high-frequency package and the wiring board can be electrically connected without degrading the transmission characteristic of high-frequency signals of 20 GHz and higher.

2. Description of the Relevant Art

A conventional high-frequency package is constructed by a semiconductor device mounting area and a high-frequency circuit on the periphery of the device, both of which are formed on a dielectric substrate, being sealed with a ring-shaped frame and a lid to be arranged thereon. A semiconductor device mounted on the semiconductor device mounting area is connected to signal lines formed so as to pass through the sidewall portion of the frame. Connecting the signal lines of the high-frequency package with the semiconductor device mounted thereon to signal lines of a wiring board makes it possible to input and output high-frequency signals from and to the outside of the package. In that connection between the high-frequency package and the wiring board, the formation of a package construction and signal lines, which make it possible to input and output high-frequency signals without degrading the high-frequency signal characteristics, is required.

FIGS. 18(a) and 18(b) are schematic diagrams showing a conventional connected construction of a high-frequency package and a wiring board of this type, and FIG. 18(a) is a sectional side view, while FIG. 18(b) is a sectional perspective view along line B—B of FIG. 18(a).

A dielectric substrate 41 is formed almost in the shape of a rectangular parallelepiped board having a thickness of T. A ground 42 is formed on the bottom surface 41b of the dielectric substrate 41, while a ring-shaped frame 44 made of dielectrics is formed in a prescribed place on the top surface 41a of the dielectric substrate 41. A plurality of thin-film-like circuit strips 43a having a width of $w_1$ are formed in prescribed places on the dielectric substrate top surface 41a in the frame inside region 44d, while lead strips 43b similar to those (having a width of $w_1$) are formed in the outside region 44e, facing the circuit strips 43a with the frame 44 between. One end portions of the circuit strips 43a and one end portions of the lead strips 43b are connected through connecting strips 43c having a width of $w_2$, which are buried within a wall portion 44a of the frame 44. A signal line 43 comprises these circuit strip 43a, lead strip 43b, and connecting strip 43c.

In order to equalize the characteristic impedance of a circuit comprising the connecting strip 43c and the wall portion 44a thereabout to those of the circuit strip 43a and the lead strip 43b, the width $w_2$ of the connecting strip 43c is set to be smaller than the widths $w_1$ of the circuit strip 43a and the lead strip 43b. In order to hold down the return loss in the signal line 43 and to make the transmission loss smaller, each characteristic impedance in the circuit strip 43a, lead strip 43b and connecting strip 43c is matched to one another.

A semiconductor device 45 is mounted almost in the center of the dielectric substrate top surface 41a in the frame inside region 44d, and pads 45a of the semiconductor device 45 and the other end portions of the circuit strips 43a are connected through bonding wires 45b. A lid 46 is joined onto the top of the frame 44 (hermetic sealing), and the frame inside region 44d on the dielectric substrate 41 is sealed thereby. A high-frequency package 40 of a microstrip line type comprises these dielectric substrate 41, ground 42, signal lines 43, frame 44, lid 46, and associated parts.

The lead strip 43b of the signal line 43 of the high-frequency package 40 is electrically connected to one end of a signal line 52 formed on a wiring board 50 through an outer lead terminal 53.

In that connected construction, high-frequency signals (not shown) are input from the signal line 52 of the wiring board 50 through the outer lead terminal 53, the lead strip 43b, connecting strip 43c and circuit strip 43a of the signal line 43 of the high-frequency package 40, and associated parts, and reach the semiconductor device 45, while high-frequency signals emitted from the semiconductor device 45 of the high-frequency package 40 are output from the circuit strip 43a of the signal line 43 through the connecting strip 43c and lead strip 43b thereof, and the outer lead terminal 53 to the signal line 52 of the wiring board 50.

However, in the connected construction of the high-frequency package 40 and the wiring board 50 as stated above, it is extremely difficult to equalize the characteristic impedance in the outer lead terminal 53 to those in the signal lines 43 and 52. Therefore, the characteristic impedance mismatch becomes large between the outer lead terminal 53 and the signal line 52 on the wiring board 50 as well as between the outer lead terminal 53 and the lead strip 43b of the signal line 43 of the high-frequency package 40. As a result, the signal reflection caused by the characteristic impedance mismatch at the junction between the outer lead terminal 53 and the signal line 52 on the wiring board 50, and that at the junction between the outer lead terminal 53 and the signal line 43 of the high-frequency package 40, becomes large. In order to cope with the problem, a connected construction has been proposed, wherein signal lines of a high-frequency package and signal lines of a wiring board are directly connected without using outer lead terminals for connecting the high-frequency package to the wiring board, through improvements in the interconnection structure of the signal lines of the high-frequency package and the like.

In Japanese Kokai No. 2000-164764, it has been disclosed that a high-frequency package and a wiring board can be connected without degrading the transmission characteristic of high-frequency signals by forming connecting pads on both sides of each connected portion of signal lines of the high-frequency package and those of the wiring board, both having transmission lines of a transmission mode of microstrip, and arranging connecting conductive vias (through hole conductors) to connect a ground layer formed within the high-frequency package to a ground layer formed within the wiring board through the connecting pads.

FIG. 19 is a sectional side view showing the connected construction of a high-frequency package and a wiring board described in the Japanese Kokai No. 2000-164764. FIGS. 20(a)–(c) are schematic diagrams showing the principal part of the connected construction of a high-frequency package and a wiring board shown in FIG. 19, wherein FIG. 20(a) is a top plan view of the high-frequency package, FIG. 20(b) is a bottom plan view thereof, and FIG. 20(c) is a top plan view of the wiring board.

Reference numeral 61 in the figure represents a dielectric substrate made of ceramics or the like. A cap-shaped lid 62 is joined to a prescribed place on the top surface of the dielectric substrate 61 through a seal portion 63. A plurality of signal lines 64 are formed in prescribed places on the top surface of the dielectric substrate 61 in the inside region 62a of the lid 62, and each one end of the signal lines 64 is connected to a semiconductor device 65.

Within the dielectric substrate 61, a ground layer 66 is formed across the dielectric substrate 61 except for slots 66a, and a microstrip line as a third high-frequency transmission line C is formed from the ground layer 66 and the signal line 64.

In addition, signal lines 67 are formed in prescribed places on the bottom surface of the dielectric substrate 61, and a microstrip line as a first high-frequency transmission line A is formed from the signal line 67 and the ground layer 66. Connecting pads 68 are formed on both sides with one end portion 67a of the signal line 67 between, and a connection 69 is formed from the one end portion 67a of the signal line 67 and the connecting pads 68. The connecting pads 68 and the ground layer 66 are connected by through hole conductors 70. The electromagnetic coupling of the first signal transmission line A and the third signal transmission line C is established through the slot 66a, and signals are transferred between both of the lines A and C. A high-frequency package 60 comprises these dielectric substrate 61, signal lines 64, ground layer 66, signal lines 67, lid 62, and associated parts.

Reference numeral 80 in the figure represents a wiring board for mounting the high-frequency package 60 thereon. On the top surface of a dielectric substrate 81 constituting the wiring board 80, signal lines 82 as second high-frequency transmission lines B and connecting pads 83 on both sides thereof are formed in the positions which are matched to those of the connections 69 formed on the underside of the dielectric substrate 61 of the high-frequency package 60. Within the dielectric substrate 81, a ground layer 84 is formed, and the connecting pads 83 and the ground layer 84 are connected by through hole conductors 85. Concave portions 81a are formed on the surface of the wiring board 80.

By making the first high-frequency transmission lines A on the bottom surface of the high-frequency package 60 faced with the second high-frequency transmission lines B on the top surface of the wiring board 80, bonding the one end portions 67a of the signal lines 67 to one end portions 82a of the signal lines 82 using a bonding material 71 such as a solder, and bonding the connecting pads 68 to the connecting pads 83 as well, a connection between the high-frequency package 60 and the wiring board 80 is provided.

It has been disclosed that, in the connected construction of the high-frequency package 60 having those connecting pads 68 and through hole conductors 70 and the wiring board 80 having those connecting pads 83 and through hole conductors 85 as stated above, the connectivity between the high-frequency package 60 having transmission lines of a transmission mode of microstrip, wherein a signal is transferred by electromagnetic coupling, and the wiring board 80 having transmission lines of a transmission mode of microstrip similarly can be improved, so that it is possible to suppress the degradation of the insertion loss $S_{21}$ in a frequency band of 30 GHz–40 GHz, compared with the case wherein the high-frequency package 60 is connected to a wiring board with no through hole conductor 85 formed therein.

In the connected construction of the high-frequency package 40 and the wiring board 50 shown in FIG. 18, as described above, the return loss of a signal in the connection through the outer lead terminal 53 increases, so that the signal cannot be transferred efficiently. Particularly in bands of sub-millimeter wavelengths and shorter, exceeding 20 GHz frequency, it is impossible to maintain a favorable transmission characteristic.

In the connected construction of the high-frequency package 60 and the wiring board 80 shown in FIGS. 19 and 20, a reduction in insertion loss $S_{21}$ in a frequency band of 30 GHz–40 GHz has been confirmed, so that the transmission characteristic (insertion loss $S_{21}$) has been improved. However, at 40 GHz and higher frequencies, the transmission characteristic is liable to be greatly degraded, and in a band of 40 GHz and higher frequencies on the higher frequency side, the transmission characteristic cannot be improved.

SUMMARY OF THE INVENTION

The present invention was developed in order to solve the above problem, and it is an object of the present invention to provide a connected construction of a high-frequency package and a wiring board having an excellent high-frequency transmission characteristic, without degrading the transmission characteristic of even high-frequency signals in a wide band ranging from 20 GHz to 80 GHz frequency in the case of connecting a high-frequency package to a wiring board.

As described above, in a conventional connected construction of a high-frequency package and a wiring board, high-frequency signals in a wide band ranging up to a high-frequency band of about 80 GHz could not be transmitted without degrading the transmission characteristic.

The present inventors paid their attention to the distances between conductive vias formed on a high-frequency transmission line substrate constituting a high-frequency package and between those formed on a wiring board, and found that by setting the distance between the conductive vias formed on the high-frequency package and the distance between the conductive vias formed on the wiring board in consideration of the dielectric constant of each dielectric substrate constituting each substrate, it is possible to transmit high-frequency signals on the higher frequency side without degrading the transmission characteristic thereof, leading to the completion of the present invention.

In order to achieve the above object, a connected construction of a high-frequency package and a wiring board (1) according to the present invention is characterized by both a first distance, between first conductive-via rows to connect first grounds formed on both main surfaces of a high-frequency transmission line substrate constituting a high-frequency packages, and a second distances, between second conductive-via rows to connect second grounds formed on both main surfaces of a wiring board on which the high-frequency package is mounted, being set in consideration of the dielectric constant of the high-frequency transmission line substrate and that of the wiring board in order to improve the high-frequency transmission characteristic between the high-frequency transmission line substrate and the wiring board.

Using the above connected construction of a high-frequency package and a wiring board (1), the increase in return loss in the connection between the high-frequency package and the wiring board can be held down and the transmission loss can be reduced, so that a connected construction of a high-frequency package and a wiring board having an excellent transmission characteristic over a high-frequency region of shorter wavelengths can be achieved.

A connected construction of a high-frequency package and a wiring board (2) according to the present invention is characterized by $W_p$ and $W_b$ being set in the range of $W_p < \lambda_0/(2 \times \in_{r1}^{1/2})$ and $W_b < \lambda_0/(2 \times \in_{r2}^{1/2})$, where $\in_{r1}$ is the dielectric constant of the high-frequency transmission line substrate, $\in_{r2}$ is the dielectric constant of the wiring board, $\lambda_0$ is the wavelength in a vacuum of a high-frequency signal propagating through signal lines, $W_p$ is the distance between the first conductive-via rows, and $W_b$ is the distance between the second conductive-via rows in the above connected construction of a high-frequency package and a wiring board (1).

Using the above connected construction of a high-frequency package and a wiring board (2), it is possible to prevent the occurrence of resonance which is caused by the distance $W_p$ between the first conductive-via rows in a high-frequency signal emitted in a direction almost perpendicular to the signal lines formed on the high-frequency transmission line substrate, and to prevent the generation of ripples. And it is also possible to prevent the occurrence of resonance which is caused by the distance $W_b$ between the second conductive-via rows in a high-frequency signal emitted in a direction almost perpendicular to the signal lines formed on the wiring board, and to prevent the generation of ripples.

Accordingly, the increase in return loss in the connection between the high-frequency package and the wiring board can be held down and the transmission loss can be reduced, so that a connected construction of a high-frequency package and a wiring board having an excellent high-frequency transmission characteristic over a high-frequency region of shorter wavelengths can be achieved.

In addition, the present inventors found that by adjusting the widths of gaps and signal lines in a joined portion of a high-frequency package and a wiring board, as the distance between first conductive-via rows formed on the high-frequency package and the distance between second conductive-via rows formed on the wiring board are set in consideration of the dielectric constant of each dielectric substrate constituting each substrate, the mountability can be improved and that the transmission characteristic can be made more excellent as well.

A connected construction of a high-frequency package and a wiring board (3) according to the present invention is characterized by the high-frequency package having first signal lines and first gaps interposed between the first signal lines and the first ground on one main surface side of the high-frequency transmission line substrate, and second signal lines, one end thereof being joined to the wiring board and the other end thereof being connected to the first signal line through a third conductive via, and second gaps interposed between the second signal lines and the first ground on the other main surface side of the high-frequency transmission line substrate. The wiring board has a third signal line and a third gap interposed between the third signal line and the second ground on the joined surface side to the high-frequency package. The width of the second gap in a joined portion of the high-frequency package and the wiring board is set to be larger than that of the second gap except in the joined portion, and/or the width of the third gap in the joined portion is set to be larger than that of the third gap except in the joined portion in the above connected construction of a high-frequency package and a wiring board (2).

Using the above connected construction of a high-frequency package and a wiring board (3), the width of the second gap in the joined portion is set to be larger than that of the second gap except in the joined portion, and/or the width of the third gap in the joined portion is set to be larger than that of the third gap except in the joined portion, so that it is possible to hold down the decrease in impedance of the second signal line and/or the third signal line in the joined portion, and to improve the impedance matching in the joined portion. Particularly, the increase in return loss in an intermediate-frequency band (10 GHz–40 GHz) can be further held down, leading to a further improvement in the transmission characteristic.

Here, it is more favorable to make the width of the second gap in the joined portion as large as possible so that the impedance of the second signal line in the joined portion can be made closer to that of the second signal line except in the joined portion (usually 50Ω), but the upper limit thereof is necessarily limited by the distance between the first conductive-via rows. Similarly, it is more favorable to make the width of the third gap in the joined portion as large as possible so that the impedance of the third signal line in the joined portion can be made closer to that of the third signal line except in the joined portion (usually 50Ω), but the upper limit thereof is necessarily limited by the distance between the second conductive-via rows.

Because of the widened gap widths, the activity of connecting the high-frequency package to the wiring board can be done easily, and the occurrence of poor connections such as a short circuit can be more certainly prevented, leading to an improvement in mountability.

A connected construction of a high-frequency package and a wiring board (4) according to the present invention is characterized by the relationships $0 < D_p \leq \lambda_0/4(\in_{r1}/2+1/2)^{1/2}$ and/or $0 < D_b \leq \lambda_0/4(\in_{r2}/2+1/2)^{1/2}$ which hold, where $D_p$ is the length of a portion of the second gap, the width thereof being set to be larger in the longitudinal direction of the second signal line, being added to the joined portion on the high-frequency transmission line substrate, and $D_b$ is the length of a portion of the third gap, the width thereof being set to be larger in the longitudinal direction of the third signal line, being added to the joined portion on the wiring board in the above connected construction of a high-frequency package and a wiring board (3).

Using the above connected construction of a high-frequency package and a wiring board (4), the lengths $D_p$ and $D_b$ are set so that the above relationships hold. Therefore, it is possible to hold down the decrease in impedance of the second signal line and/or the third signal line in the gap portions extended by the lengths $D_p$ and $D_b$, the widths thereof being set to be larger. As a result, the impedance matching between the second and third signal lines in the joined portion can be further improved.

In addition, since a margin of the length $D_p$ or $D_b$ can be added to the width of the joined portion, the activity of connecting the high-frequency package to the wiring board can be done more easily, and the occurrence of poor connections such as a short circuit can be further reduced, leading to a further improvement in mountability.

A connected construction of a high-frequency package and a wiring board (5) according to the present invention is characterized by a prescribed region ranging from the end portion on the third-conductive-via connecting side of the first signal line to one side plane on the wiring-board connected side on the high-frequency transmission line substrate, wherein the first ground is not formed in the above connected construction of a high-frequency package and a wiring board (3) or (4).

Using the above connected construction of a high-frequency package and a wiring board (5), the first ground is not formed in the prescribed region, so that the capacitive component between the second signal line and the first ground, and that between the third signal line and the first ground can be made smaller. As a result, particularly, the degradation of the transmission characteristic in a high-frequency region can be prevented and the impedance matching can be achieved across a much higher frequency region, leading to the realization of a connected construction of a high-frequency package and a wiring board having an excellent transmission characteristic.

A connected construction of a high-frequency package and a wiring board (6) according to the present invention is characterized by the prescribed region including at least a portion facing the second signal line between the end portion on the third-conductive-via connecting side of the first signal line and the one side plane on the wiring-board connected side in the above connected construction of a high-frequency package and a wiring board (5).

Using the above connected construction of a high-frequency package and a wiring board (6), the capacitive component between the second signal line and the first ground, and that between the third signal line and the first ground can be further smaller. As a result, by holding down the decrease in impedance related to the second signal line on a higher frequency side, the impedance matching in the joined portion can be improved.

A connected construction of a high-frequency package and a wiring board (7) according to the present invention is characterized by a lid for sealing the high-frequency package, or a frame formed on a sealing portion, being made of an insulating material when the prescribed region overlaps the sealing portion of the high-frequency package in the above connected construction of a high-frequency package and a wiring board (5) or (6).

Using the above connected construction of a high-frequency package and a wiring board (7), the effect of preventing the degradation of the transmission characteristic in a high-frequency region, which can be obtained through not forming the first ground in the prescribed region, can be obtained with reliability.

BRIEF DESCRIPTION OF THE DRAWINGS

FIGS. 2 comprise enlarged diagrammatic views showing the principal part of the connected construction of a high-frequency package and a wiring board according to the embodiment (1), wherein

FIGS. 3 comprise enlarged diagrammatic views showing the principal part of a connected construction of a high-frequency package and a wiring board according to an embodiment (2), wherein

FIGS. 4 comprise enlarged exploded diagrammatic views showing the principal parts of a high-frequency package and a wiring board for describing a connected construction of a high-frequency package and a wiring board according to an embodiment (3), wherein FIG. 4(a) is a plan view, while

FIGS. 5 comprise enlarged exploded diagrammatic views showing the principal parts of a high-frequency package and a wiring board for describing a connected construction of a high-frequency package and a wiring board according to an embodiment (4), wherein FIG. 5(a) is a plan view, while

FIGS. 6 comprise enlarged exploded diagrammatic views showing the principal parts of a high-frequency package and a wiring board for describing a connected construction of a high-frequency package and a wiring board according to an embodiment (5), wherein FIG. 6(a) is a plan view, while

FIGS. 18 comprise schematic diagrams showing a conventional connected construction of a high-frequency package and a wiring board, wherein FIG. 18(a) is a sectional side view, while

FIGS. 20 comprise schematic diagrams showing the connected construction of a high-frequency package and a wiring board of FIG. 19, wherein

DETAILED DESCRIPTION OF THE PREFERRED EMBODIMENTS

Figure 1:
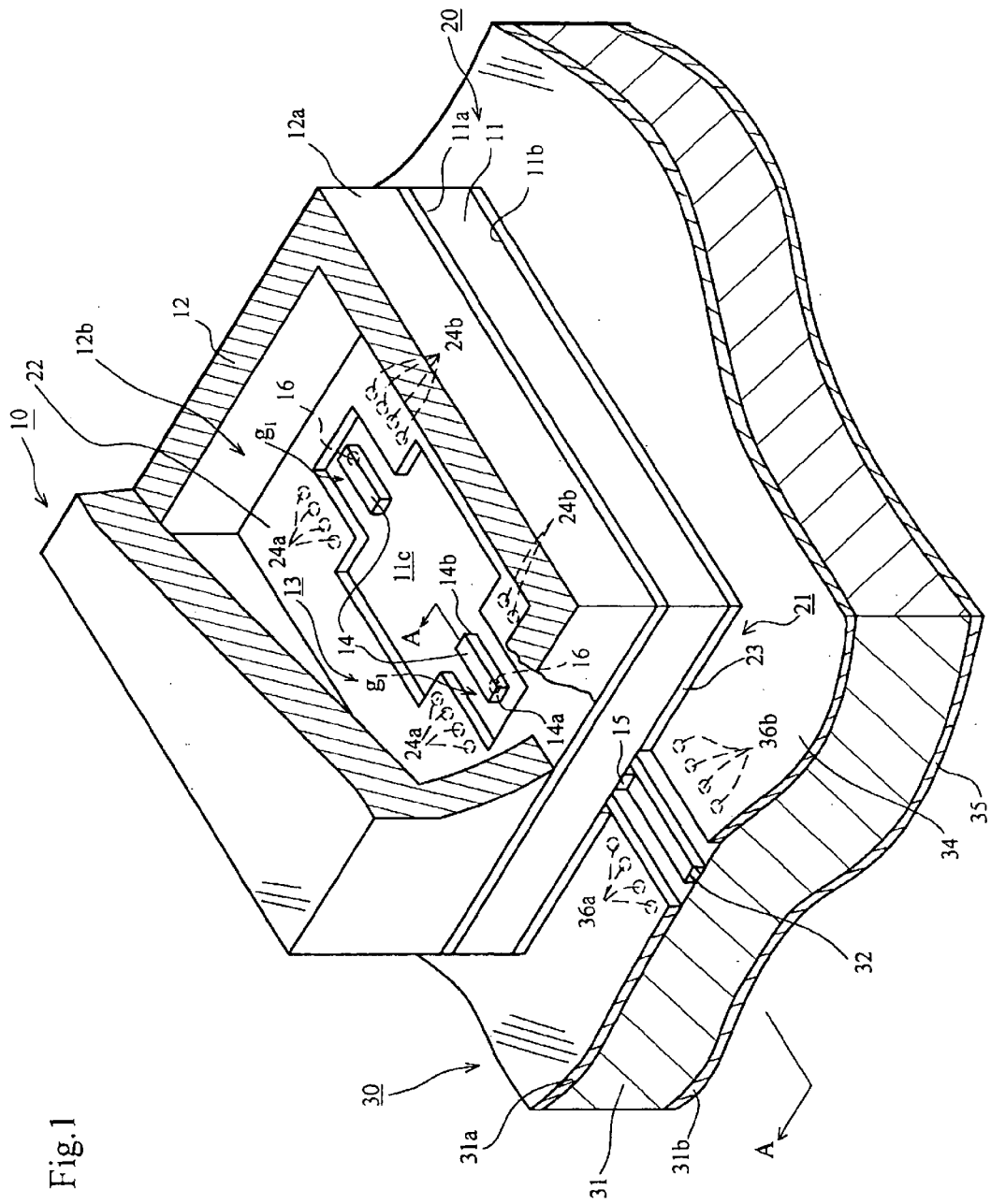
FIG. 1 is a perspective view partly in section schematically showing a connected construction of a high-frequency package and a wiring board according to an embodiment (1) of the present invention.
Figure 2A:
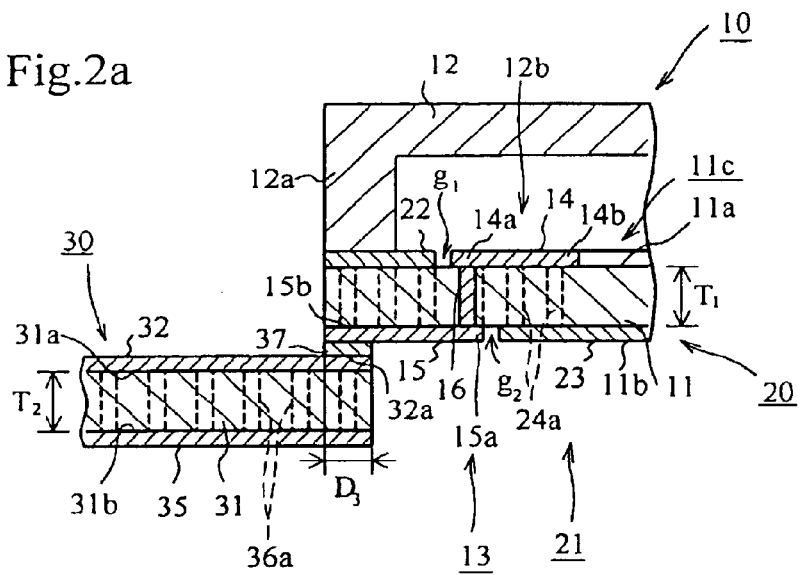
FIG. 2(a) is a sectional view along A—A line of FIG. 1.
Figure 2B:
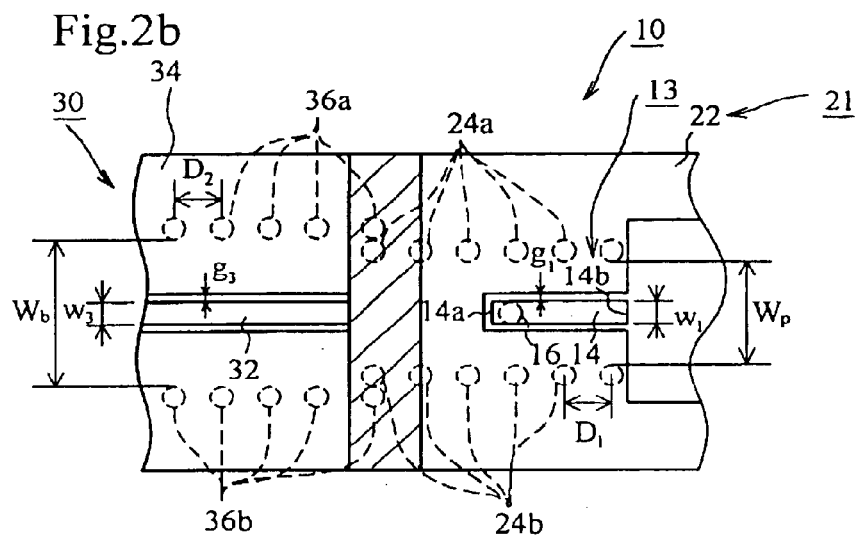
FIG. 2(b) is a plan view.
Figure 2C:
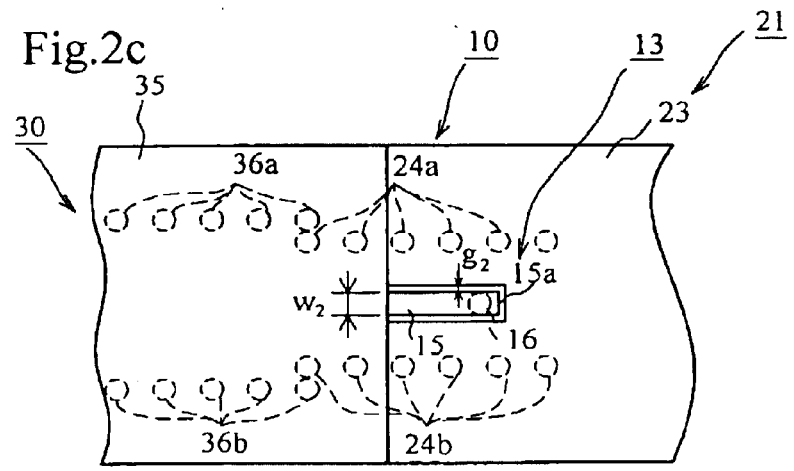
FIG. 2(c) is a bottom plan view.

The preferred embodiments of the connected construction of a high-frequency package and a wiring board according to the present invention are described below by reference to those Figures. FIG. 1 is a perspective view partly in section schematically showing a connected construction of a high-frequency package and a wiring board according to an embodiment (1). FIGS. 2(a)–(c) are enlarged diagrammatic views showing the principal part of the connected construction of a high-frequency package and a wiring board according to the embodiment (1), wherein FIG. 2(a) is a sectional view along line A—A of FIG. 1, FIG. 2(b) is a plan view, and FIG. 2(c) is a bottom plan view.

Reference numeral 20 in the figure represents a high-frequency transmission line substrate comprising a dielectric substrate 11. The dielectric substrate 11 is made of alumina ceramics or the like in the shape of a rectangular parallelepiped board having a thickness of $T_1$. A cap-shaped lid 12 is joined to a prescribed place on the dielectric substrate top surface 11a. The lid 12 is made of Koval or invar having almost the same coefficient of expansion as that of the dielectric substrate 11.

A space 11c for mounting a semiconductor device (not shown) is formed almost in the center of the lid inside region 12b. Thin-film-like signal lines 14 having a width of $w_1$ are formed in prescribed places facing each other with the space 11c between on the dielectric substrate top surface 11a. A ground 22 is formed around the signal lines 14 with gaps $g_1$ interposed between. They constitute a coplanar strip line. On the other hand, thin-film-like signal lines 15 having a width of $w_2$ are formed in prescribed places on the dielectric substrate bottom surface 11b. A ground 23 is formed around the signal lines 15 with gaps $g_2$ interposed between. They constitute a coplanar strip line.

The upper end portion of a conductive via 16 is connected to the end portion 14a of the signal line 14, while the lower end portion of the conductive via 16 is connected to the end portion 15a of the signal line 15. A signal interconnection 13 comprises these signal line 14, conductive via 16, and signal line 15.

Conductive vias 24a and 24b for connecting the grounds 22 and 23 are formed on both sides with the signal lines 14 and 15 between, respectively. The interval between the conductive vias 24a and 24a, or 24b and 24b is set to be $D_1$. This interval $D_1$ is set in the range of $D_1 < \lambda_0/(2 \times \in_{r1}^{1/2})$, where $\in_{r1}$ is the dielectric constant of the dielectric substrate 11 and $\lambda_0$ is the wavelength in a vacuum of a high-frequency signal propagating through the signal interconnection 13. Therefore, it is possible to prevent high-frequency signals emitted from the signal interconnection 13 in a direction perpendicular to the signal lines 14 and 15 from leaking to the dielectric substrate 11 portion through the intervals $D_1$ between the conductive vias 24a or 24b, and to prevent the generation of ripples which is caused by the undesired mode originating in the intervals $D_1$. Here, it is more favorable to make the lower limit of the interval $D_1$ as small as possible, but it is necessarily controlled by the technique of forming the conductive vias 24a or 24b closer to each other on the dielectric substrate 11.

The distance between the closer sides of the conductive vias 24a and 24b to each other, both being formed with the signal lines 14 and 15 between, is set to be $W_p$. This distance $W_p$ is set in the range of $W_p < \lambda_0/(2 \times \in_{r1}^{1/2})$, where $\in_{r1}$ is the dielectric constant of the dielectric substrate 11 and $\lambda_0$ is the wavelength in a vacuum of a high-frequency signal propagating through the signal interconnection 13. Therefore, it is possible to prevent the occurrence of resonance in high-frequency signals emitted from the signal interconnection 13 in a direction almost perpendicular to the signal lines 14 and 15, which is caused by the distance $W_p$ between the conductive vias 24a and 24b, and to prevent the generation of ripples. Here, it is more favorable to make the lower limit of the distance $W_p$ as small as possible, but actually, it is necessarily limited by the widths $w_1$ and $w_2$ of the signal lines 14 and 15, the gaps $g_1$ and $g_2$, or the like. A ground interconnection 21 comprises the ground 22, conductive vias 24a and 24b, and ground 23. A coplanar strip line comprises these ground interconnection 21 and signal interconnection 13, and onto the coplanar strip line in the vicinity of the space 11c, a semiconductor device, which is not shown, is to be connected by wire bonding or the like.

Reference numeral 30 in the figure represents a wiring board for mounting a high-frequency package 10 thereon. A dielectric substrate 31 constituting the wiring board 30 is made of alumina ceramics or the like. A thin-film-like signal line 32 having a width of $w_3$ is formed in a prescribed place on the dielectric substrate top surface 31a. A ground 34 is formed around the signal line 32 with a gap $g_3$ interposed between. They constitute a coplanar strip line. On the other hand, a ground 35 is formed on the dielectric substrate bottom surface 31b.

Conductive vias 36a and 36b for connecting the grounds 34 and 35 are formed on both sides with the signal line 32 between, respectively. The interval between the conductive vias 36a and 36a, or 36b and 36b is set to be $D_2$. This interval $D_2$ is set in the range of $D_2 < \lambda_0/(2 \times \in_{r2}^{1/2})$, where $\in_{r2}$ is the dielectric constant of the dielectric substrate 31 and $\lambda_0$ is the wavelength in a vacuum of a high-frequency signal propagating through the signal line 32. Therefore, it is possible to prevent high-frequency signals emitted in a direction perpendicular to the signal line 32 from leaking to the dielectric substrate 31 portion through the intervals $D_2$ between the conductive vias 36a or 36b, and to prevent the generation of ripples which is caused by the undesired mode originating in the intervals $D_2$. Here, it is more favorable to make the lower limit of the interval $D_2$ as small as possible, but it is necessarily controlled by the technique of forming the conductive vias 36a or 36b closer to each other on the dielectric substrate 31.

The distance between the closer sides of the conductive vias 36a and 36b to each other, both being formed with the signal line 32 between, is set to be $W_b$. This distance $W_b$ is set in the range of $W_b < \lambda_0/(2 \times \in_{r2}^{1/2})$, where $\in_{r2}$ is the dielectric constant of the dielectric substrate 31 and $\lambda_0$ is the wavelength in a vacuum of a high-frequency signal propagating through the signal line 32. Therefore, it is possible to prevent the occurrence of resonance in high-frequency signals emitted in a direction almost perpendicular to the signal line 32, which is caused by the distance $W_b$ between the conductive vias 36a and 36b, and to prevent the generation of ripples. Here, it is more favorable to make the lower limit of the distance $W_b$ as small as possible, but actually, it is necessarily limited by the width $w_3$ of the signal line 32, the gap $g_3$, or the like. A ground interconnection 33 comprises the these ground 34, conductive vias 36a and 36b, and ground 35.

In mounting the above high-frequency package 10 on the wiring board 30, the signal line 15 on the bottom surface of the high-frequency package 10 and the signal line 32 on the top surface of the wiring board 30 are caused to face each other, and the end portion 15b of the signal line 15 and the end portion 32a of the signal line 32 are joined using a bonding material 37 such as a solder. Here, it is more preferable that the width $D_3$ of the joined portion wherein the signal lines 15 and 32 are overlaid be as small as possible in order to hold down the return loss in the connection as much as possible and to make the transmission characteristic more favorable. Therefore, an appropriate connection width $D_3$ may be set in consideration of the connection strength between the high-frequency package 10 and the wiring board 30.

In the connected construction of the high-frequency package 10 and the wiring board 30 as stated above, a high-frequency signal (not shown) is input from the signal line end portion 32a of the wiring board 30 through the bonding material 37, the signal line end portion 15b of the high-frequency package 10, the signal interconnection 13 and the signal line end portion 14b, and reaches a semiconductor device (not shown), while being output from the semiconductor device through the signal line end portion 14b, the signal interconnection 13, the signal line end portion 15b and the bonding material 37 to the signal line 32 of the wiring board 30.

In the connected construction of the high-frequency package 10 and the wiring board 30 according to the embodiment (1), the distance between the conductive vias 24a and the conductive vias 24b to connect the grounds 22 and 23 formed on both main surfaces of the high-frequency transmission line substrate 20, and the distance between the conductive vias 36a and the conductive vias 36b to connect the grounds 34 and 35 formed on both main surfaces of the wiring board 30 are set in consideration of the dielectric constant of the high-frequency transmission line substrate 20 and that of the wiring board 30, which have an effect on the transmission characteristic of signals in a high-frequency region. Therefore, it is possible to hold down the increase in return loss in the connection between the high-frequency package 10 and the wiring board 30, and to reduce the transmission loss, leading to the realization of a connected construction of a high-frequency package and a wiring board having an excellent transmission characteristic over a high-frequency region of shorter wavelengths.

Where $W_p$ is the distance between the conductive vias 24a and 24b of the high-frequency package 10, and $W_b$ is the distance between the conductive vias 36a and 36b of the wiring board 30, the distances $W_p$ and $W_b$ are set in the range of $W_p < \lambda_0/(2 \times \in_{r1}^{1/2})$ and $W_b < \lambda_0/(2 \times \in_{r2}^{1/2})$. Therefore, it is possible to prevent the occurrence of resonance in high-frequency signals emitted from the signal interconnection 13 in a direction almost perpendicular to the signal lines 14 and 15, which is caused by the distance $W_p$ between the conductive vias 24a and 24b, and to prevent the generation of ripples. And it is possible to prevent the occurrence of resonance in high-frequency signals emitted in a direction almost perpendicular to the signal line 32, which is caused by the distance $W_b$ between the conductive vias 36a and 36b, and to prevent the generation of ripples.

Accordingly, it is possible to hold down the increase in return loss in the connection between the high-frequency package 10 and the wiring board 30 and to reduce the transmission loss, leading to the realization of a connected construction of a high-frequency package and a wiring board having an excellent high-frequency characteristic over a high-frequency region of shorter wavelengths.

In the above connected construction of the high-frequency package 10 and the wiring board 30 according to the embodiment (1), described is the connected construction wherein the underside of the dielectric substrate 11 of the high-frequency package 10 is open, but in another embodiment, the wiring board 30 may be arranged under the dielectric substrate 11. In this case, it is desirable to design again the width $w_2$ of the signal line 15, and the gap $g_2$ between the signal line 15 and the ground 23, in consideration of the dielectric constant of the dielectric substrate 31 of the wiring board 30.

In the above connected construction of the high-frequency package 10 and the wiring board 30 according to the embodiment (1), described is the case wherein the signal lines 15 and 32 are connected by soldering, but in another embodiment, bumps may be formed beforehand on the one end portion 15a of the signal line 15 of the high-frequency package 10, or the one end portion 32a of the signal line 32 of the wiring board 30. By connecting the high-frequency package 10 to the wiring board 30 using the bumps, the transmission loss can be further held down.

Figure 3A:
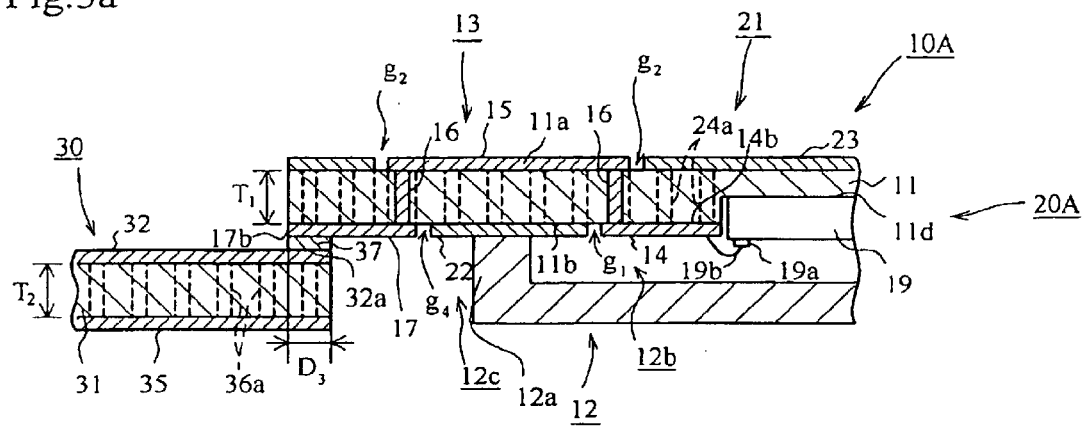
FIG. 3(a) is a sectional view.
Figure 3B:
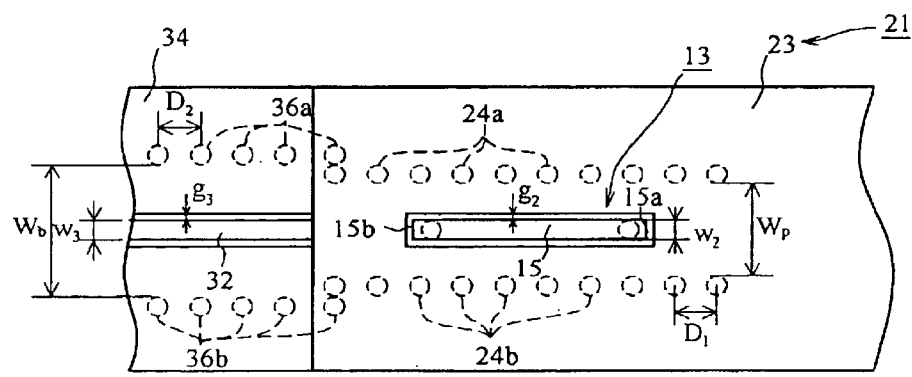
FIG. 3(b) is a plan view.
Figure 3C:
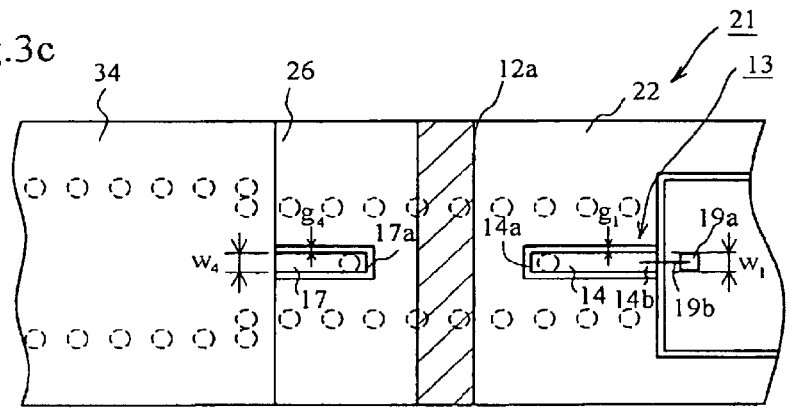
FIG. 3(c) is a bottom plan view.

FIGS. 3(a)–(c) are enlarged diagrammatic views showing the principal part of a connected construction of a high-frequency package and a wiring board according to an embodiment (2), wherein FIG. 3(a) is a sectional view, FIG. 3(b) is a plan view and FIG. 3(c) is a bottom plan view. Here, the same marks are affixed to the components having the same functions as those in the embodiment (1).

The difference between the connected constructions of a high-frequency package and a wiring board according to the embodiments (1) and (2) is the construction of a high-frequency package.

On the bottom surface of a dielectric substrate 11 of a high-frequency transmission line substrate 20A constituting a high-frequency package 10A, a concave portion 11d for mounting a semiconductor device 19 therein is formed, and a cap-shaped lid 12 is joined to a prescribed place on the dielectric substrate bottom surface 11b. A thin-film-like signal line 14 having a width of $w_1$ is formed in a prescribed place between the concave portion 11d in a lid inside region 12b and a wall portion 12a. The end portion 14b of the signal line 14 is connected through a wire 19b with a pad 19a of the semiconductor device 19. In the sidewall outside region 12c of the lid 12, a thin-film-like signal line 17 having a width of $w_4$ is formed in a place facing the signal line 14 with the sidewall portion 12a between.

Grounds 22 and 26 are formed in one piece around the signal lines 14 and 17 with gaps $g_1$, and $g_4$ interposed between, respectively, and they constitute a coplanar strip line. On the other hand, a thin-film-like signal line 15 having a width of $w_2$ is formed in a prescribed place on the dielectric substrate top surface 11a. A ground 23 is formed around the signal line 15 with a gap $g_2$ interposed between, and they constitute a coplanar strip line.

The lower end portions of conductive vias 16 are connected to the end portions 14a and 17a of the signal lines 14 and 17, respectively, while the upper end portions of the conductive vias 16 are connected to both end portions 15a and 15b of the signal line 15. A signal interconnection 13 comprises the signal line 14, conductive via 16, signal line 15, conductive via 16 and signal line 17.

On both sides of the signal lines 14, 15 and 17, conductive vias 24a and 24b to connect the grounds 22 and 26 with the ground 23 are formed, respectively. The interval $D_1$ between the conductive vias 24a and 24a, or 24b and 24b is set to satisfy $D_1 < \lambda_0/(2 \times \in_{r1}^{1/2})$, as in the embodiment (1). And the distance $W_p$ between the closer sides of the conductive vias 24a and 24b to each other is set to satisfy $W_p < \lambda_0/(2 \times \in_{r1}^{1/2})$, as in the embodiment (1). A ground interconnection 21 comprises the ground 22, conductive vias 24a and 24b, ground 23, conductive vias 24a and 24b, and ground 26. A coplanar strip line comprises the ground interconnection 21 and signal interconnection 13.

Reference numeral 30 in the figure represents a wiring board for mounting the high-frequency package 10A thereon, the construction of which is almost the same as that of the wiring board 30 in the embodiment (1).

In mounting the above high-frequency package 10A on the wiring board 30, the signal line 17 on the bottom surface of the high-frequency package 10A and a signal line 32 on the top surface of the wiring board 30 are caused to face each other and the end portion 17b of the signal line 17 and the end portion 32a of the signal line 32 are joined using a bonding material 37 such as a solder. Here, it is more preferable that the width $D_3$ of the joined portion wherein the signal lines 17 and 32 are overlaid be as small as possible in order to hold down the return loss in the connection as much as possible and to make the transmission characteristic further favorable. Therefore, an appropriate connection width $D_3$ may be set in consideration of the connection strength between the high-frequency package 10A and the wiring board 30, in the same manner as in the embodiment (1).

In the connected construction of the high-frequency package 10A and the wiring board 30 as stated above, a high-frequency signal (not shown) is input from the signal line end portion 32a of the wiring board 30 through the bonding material 37, the signal line end portion 17b of the high-frequency package 10A, the signal interconnection 13 and the signal line end portion 14b to the semiconductor device 19, while being output from the semiconductor device 19 through the signal line end portion 14b, the signal interconnection 13, the signal line end portion 17b, and the bonding material 37 to the signal line 32 of the wiring board 30.

In the connected construction of the high-frequency package and the wiring board in the above embodiment (2), almost the same effects as those in the embodiment (1) can be obtained. In addition, by arranging the semiconductor device mounting area 11d in the high-frequency package 10A on the connected surface side to the wiring board 30, the total thickness can be made smaller, leading to space-saving of the mounting portion.

Figure 4A:
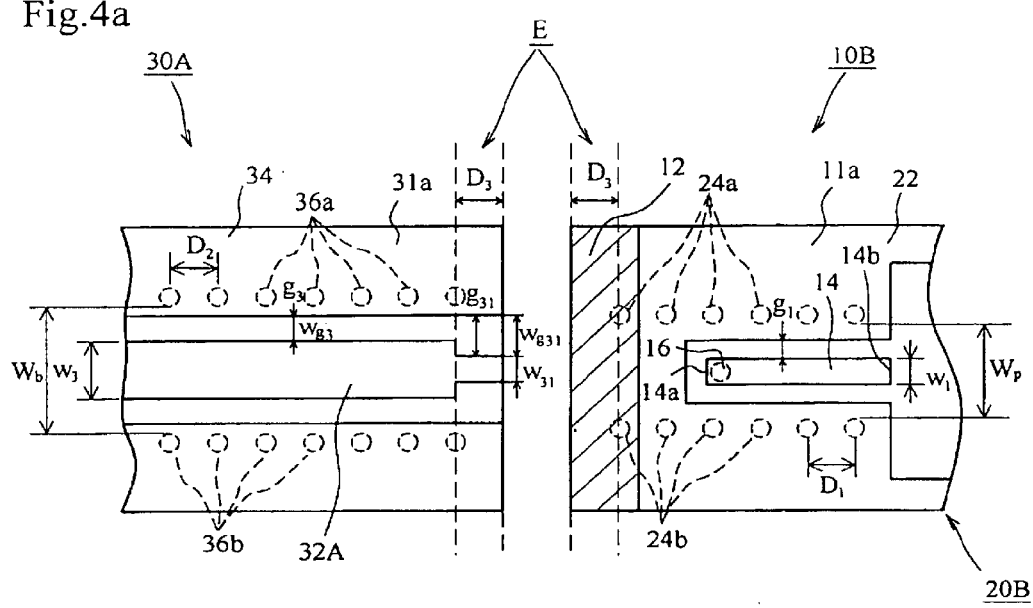
Figure 4B:
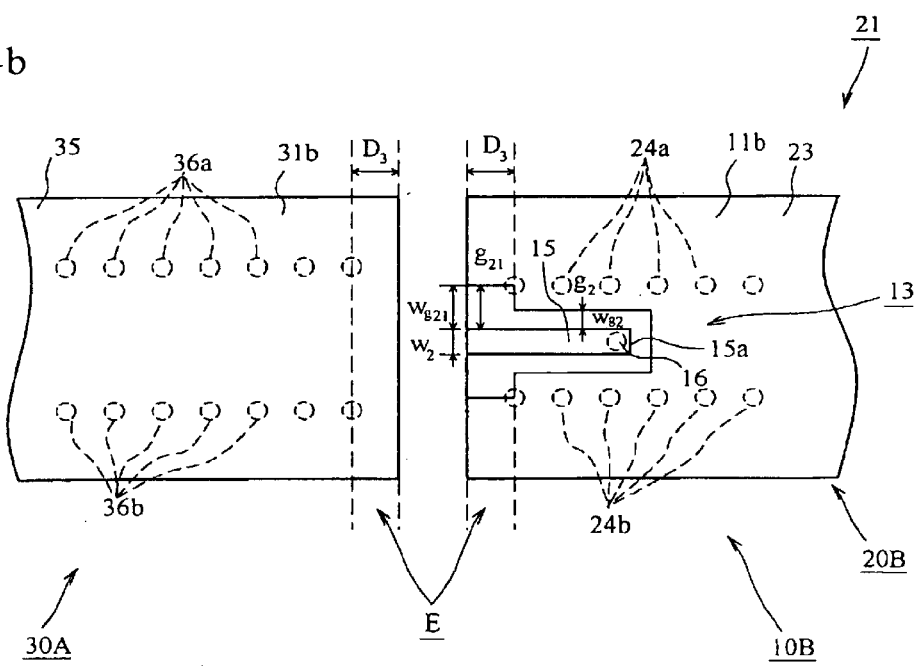
FIG. 4(b) is a bottom plan view.

A connected construction of a high-frequency package and a wiring board according to an embodiment (3) is described below. FIGS. 4 comprise comprises enlarged exploded views schematically showing the principal parts of a high-frequency package and a wiring board for the description of the connected construction of a high-frequency package and a wiring board according to the embodiment (3), wherein FIG. 4(a) is a plan view, while FIG. 4(b) is a bottom plan view. Here, the same marks are affixed to the components having the same functions as those in the embodiment (1).

The difference between the connected constructions of a high-frequency package and a wiring board according to the embodiments (3) and (1) is the construction of a joined portion E wherein a high-frequency package 10B and a wiring board 30A are joined.

In the embodiment (1), assumed is the case wherein the dielectric constants of the dielectric substrates 11 and 31 of the high-frequency package 10 and the wiring board 30, respectively, and the thicknesses thereof are the same, and the width $w_2$ of the signal line 15 and the width $w_3$ of the signal line 32, and the width of the gap $g_2$ and the width of the gap $g_3$ are set to be close values, respectively. However, in some actual cases, the dielectric constants of the dielectric substrates 11 and 31, the thicknesses $T_1$ and $T_2$ thereof, or the widths of the signal lines 15 and 32 formed on the dielectric substrates 11 and 31, respectively, are largely different.

In those cases, in order to match between the impedance of the signal line 15 of the high-frequency package 10 and that of the signal line 32 of the wiring board 30 in the joined portion E, the widths of the signal lines 15 and 32, the widths of the gap $g_2$ between the signal line 15 and the ground 23, and the gap $g_3$ between the signal line 32 and the ground 34, respectively, or the like must be set to be appropriate values in accordance with the dielectric constants of the dielectric substrates 11 and 31, and the thicknesses $T_1$ and $T_2$ thereof.

However, when the width of the signal line 15 of the high-frequency package 10, the width of the signal line 32 of the wiring board 30, and the widths of the gaps $g_2$ and $g_3$ are set to be different values from each other, for example, when the widths of the signal lines 15 and 32 are the same ($w_2=w_3$), and the gap $g_2$ of the high-frequency package 10 is smaller than the gap $g_3$ of the wiring board 30 ($g_3>g_2$), the possibility of poor connections becomes high in making a connection with these conditions, since a displacement in the connection causes a contact of the signal line 32 of the wiring board 30 with the ground 23 of the high-frequency package 10, leading to a short circuit, or a solder bridge is generated in joining using a solder or the like, leading to a short circuit.

When the width $w_3$ of the signal line 32 of the wiring board 30 is larger than the width including the signal line 15 of the high-frequency package 10 and the gaps $g_2$ arranged on both sides thereof ($w_2+2\times g_2$), it is impossible to establish a connection between the ground 23 of the high-frequency package 10 and the signal line 32 of the wiring board 30 without making a short circuit.

Using the connected construction of a high-frequency package and a wiring board according to the embodiment (3), the impedance matching in a joined portion E can be improved, an excellent transmission characteristic can be obtained, and the mountability can be further improved, even when the dielectric constants of dielectric substrates 11 and 31, the thicknesses $T_1$ and $T_2$ thereof, the widths $w_2$ and $w_3$ of signal lines 15 and 32A formed on the dielectric substrates 11 and 31, and the widths $w_{g2}$ and $w_{g3}$ of gaps $g_2$ and $g_3$, respectively, are set to be different values from each other.

A thin-film-like signal line 15 having a width of $w_2$ is formed in a prescribed place on the dielectric substrate bottom surface 11b of a high-frequency transmission line substrate 20B constituting a high-frequency package 10B. A ground 23 is formed around the signal line 15 with gaps $g_2$ and $g_{21}$ interposed between, and the width $w_{g21}$ of the gap $g_{21}$ formed in a joined portion E is set to be larger than the width $w_{g2}$ of the gap $g_2$ except in the joined portion E.

A thin-film-like signal line 32A having a width of $w_{31}$ in the joined portion E and a width of $w_3$ except in the joined portion E is formed in a prescribed place on the dielectric substrate top surface 31a constituting a wiring board 30A. A ground 34 is formed around the signal line 32A with gaps $g_3$ and $g_{31}$ interposed between. They constitute a coplanar strip line. On the other hand, a ground 35 is formed on the dielectric substrate bottom surface 31b.

The width $w_{g21}$ of the gap $g_{21}$ is set as needed in consideration of the width $w_{31}$ of the signal line 32A and the width $w_{g31}$ of the gap $g_{31}$ of the wiring board 30A in the joined portion E, or the like.

The width $w_{g31}$ of the gap $g_{31}$ formed in the joined portion E is set to be larger than the width $w_{g3}$ of the gap $g_3$ except in the joined portion E by the same width as the width $w_{31}$ of the signal line 32A in the joined portion E is set to be smaller than the width $w_3$ of the signal line 32A except in the joined portion E. The width $w_{g31}$ of the gap $g_{31}$ is set in consideration of the width $w_2$ of the signal line 15 and the width $w_{g21}$ of the gap $g_{21}$ of the high-frequency package 10B in the joined portion E, or the like.

In other words, the width $w_2$ of the signal line 15 of the high-frequency package 10B and the width $w_{31}$ of the signal line 32A of the wiring board 30A in the joined portion E are allowed to agree with each other, and moreover, the width $w_{g21}$ of the gap $g_{21}$ and the width $w_{g31}$ of the gap $g_{31}$ therein are allowed to agree with each other.

Since the other components are almost the same as those shown in FIGS. 1 and 2, the detailed descriptions thereof are not included here.

In the connected construction of the high-frequency package 10B and the wiring board 30A as stated above, a high-frequency signal (not shown) is input and output in the same manner as in the connected construction of the high-frequency package 10 and the wiring board 30 according to the embodiment (1).

Using the above connected construction of the high-frequency package 10B and the wiring board 30A according to the embodiment (3), almost the same effects as those in the embodiment (1) can be obtained. Moreover, since the width $w_{g21}$ of the gap $g_{21}$ of the high-frequency package 10B in the joined portion E is set to be larger than the width $w_{g2}$ of the gap $g_2$ except in the joined portion E, while the width $w_{g31}$ of the gap $g_{31}$ of the wiring board 30A in the joined portion E is set to be larger than the width $w_{g3}$ of the gap $g_3$ except in the joined portion E, the decrease in impedance of the signal lines 15 and 32A in the joined portion E can be held down, so that the impedance matching in the joined portion E can be improved. Particularly, the increase in return loss in an intermediate-frequency band (10 GHz–40 GHz) can be further held down, leading to a further improvement in the transmission characteristic.

The widened width $w_{g21}$ of the gap $g_{21}$ and the widened width $w_{g31}$ of the gap $g_{31}$ make it possible to easily perform the activity of connecting the high-frequency package 10B to the wiring board 30A, and to more certainly prevent the occurrence of poor connections such as a short circuit, leading to an improvement in mountability.

Here, in the embodiment (3), described is the case wherein the width $w_2$ of the signal line 15 of the high-frequency package 10B and the width $w_{31}$ of the signal line 32A of the wiring board 30A in the joined portion E are allowed to agree with each other, and moreover, the width $w_{g21}$ of the gap $g_{21}$ and the width $w_{g31}$ of the gap $g_{31}$ therein are allowed to agree with each other ($w_2=w_{31}$, $w_{g21}=w_{g31}$), but the width $w_2$ of the signal line 15 of the high-frequency package 10B and the width $w_{31}$ of the signal line 32A of the wiring board 30A in the joined portion E, or the width $w_{g21}$ of the gap $g_{21}$ and the width $w_{g31}$ of the gap $g_{31}$ therein are not necessarily allowed to agree with each other. The width $w_{g21}$ of the gap $g_{21}$ in the joined portion E may be set to be larger than the width $w_{g2}$ of the gap $g_2$ except in the joined portion E, and the width $w_{g31}$ of the gap $g_{31}$ in the joined portion E may be set to be larger than the width $w_{g3}$ of the gap $g_3$ except in the joined portion E so that the decrease in impedance in the joined portion E can be sufficiently held down.

In still another embodiment, the width $w_2$ of the signal line 15 of the high-frequency package 10B and the width $w_{31}$ of the signal line 32A of the wiring board 30A in the joined portion E may be further smaller, and the width $w_{g21}$ of the gap $g_{21}$ and the width $w_{g31}$ of the gap $g_{31}$ may be larger by those widths. Using such construction, the decrease in impedance in the joined portion E can be further held down, leading to a further improvement in impedance matching in the joined portion E.

Figure 5A:
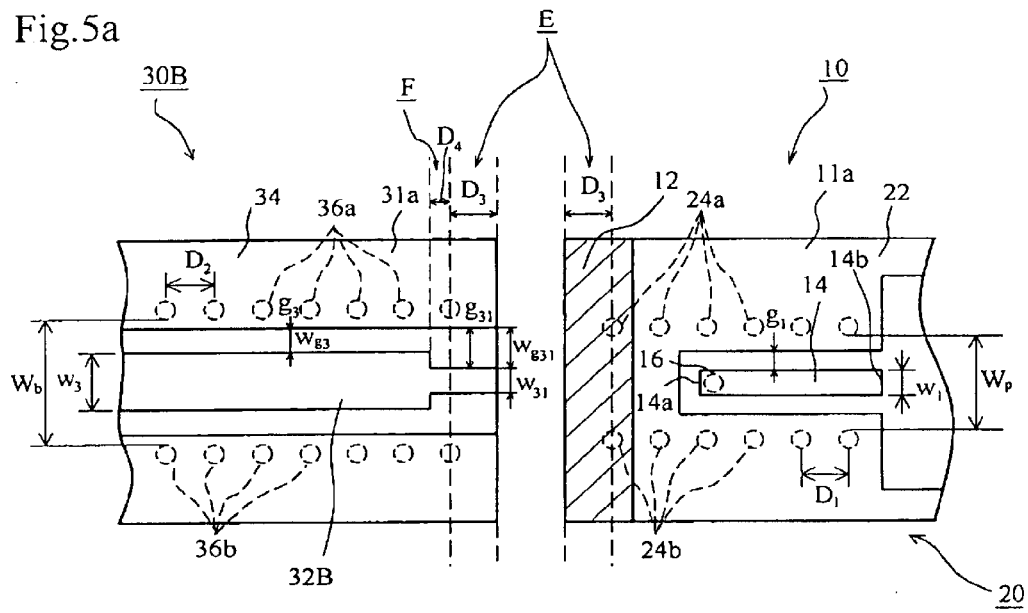
Figure 5B:
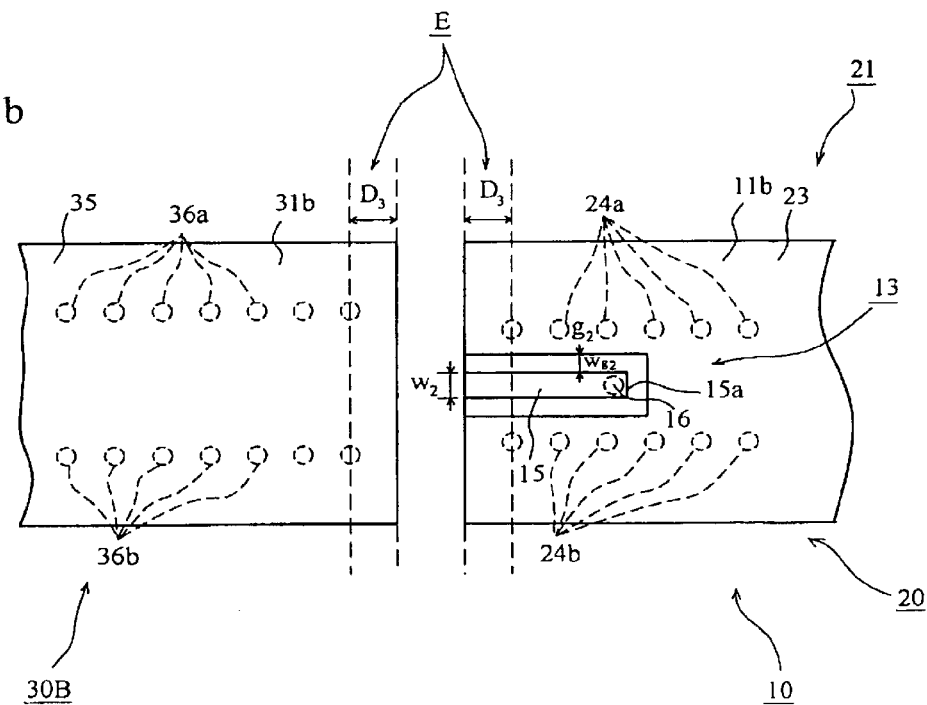
FIG. 5(b) is a bottom plan view.

A connected construction of a high-frequency package and a wiring board according to an embodiment (4) is described below. FIGS. 5 comprise enlarged exploded views schematically showing the principal parts of a high-frequency package and a wiring board for describing the connected construction of a high-frequency package and a wiring board according to the embodiment (4), wherein FIG. 5(a) is a plan view, while FIG. 5(b) is a bottom plan view. Here, the same marks are affixed to the components having the same functions as those in the embodiment (1), which are not described.

The difference between the connected constructions of a high-frequency package and a wiring board according to the embodiments (4) and (1) is the construction of a wiring board 30B.

A thin-film-like signal line 32B, having a width of $w_{31}$ in a joined portion E and a region F which is an extended portion by a length $D_4$ in the longitudinal direction of the signal line 32B from the joined portion E and a width of $w_3$ except in those portions, is formed in a prescribed place on the dielectric substrate top surface 31a constituting the wiring board 30B. A ground 34 is formed around the signal line 32B with gaps $g_{31}$ and $g_3$ interposed between. They constitute a coplanar strip line. On the other hand, a ground 35 is formed on the dielectric substrate bottom surface 31b.

The width $w_{g31}$ of the gap $g_{31}$ formed in the joined portion E and region F is set to be larger than the width $w_{g3}$ of the gap $g_3$ by the same width as the width $w_{31}$ of the signal line 32B in the joined portion E is set to be smaller than the width $w_3$ of the signal line 32B except in the joined portion E and region F. The width $w_{g31}$ of the gap $g_{31}$ is set in consideration of the width $w_2$ of the signal line 15 and the width $w_{g2}$ of the gap $g_2$ of the high-frequency package 10 in the joined portion E, or the like.

The length $D_4$ in the region F is set in the range of $0<D_4\leq\lambda_0/4(\epsilon_{r2}/2+1/2)^{1/2}$. Therefore, the decrease in impedance of the signal line 32B in the gap $g_{31}$ portion extended by the length $D_4$ the width of which is set to be larger can be held down, so that the impedance matching between the signal lines 15 and 32B in the joined portion E can be improved. Here, it is not desirable that the length $D_4$ be made larger than $\lambda_0/4(\epsilon_{r2}/2+1/2)^{1/2}$, since the impedance except in the joined portion E becomes larger, so that the influence of an increased return loss becomes greater, leading to the degradation of the transmission characteristic.

In the connected construction of the high-frequency package 10 and the wiring board 30B as stated above, a high-frequency signal (not shown) is input and output in the same manner as in the connected construction of the high-frequency package 10 and the wiring board 30 according to the embodiment (1).

Using the connected construction of the high-frequency package 10 and the wiring board 30B according to the embodiment (4), since the region of the gap $g_{31}$ having a larger width is additionally extended by the length $D_4$ in the longitudinal direction of the signal line 32B from the joined portion E, the decrease in impedance of the signal line 32B can be held down. As a result, for example, even when the width $w_{g31}$ of the gap $g_{31}$ in the joined portion E cannot be made so large as the decrease in impedance can be sufficiently held down, the decrease in impedance of the signal line 32B can be held down and the impedance matching between the signal lines 15 and 32B in the joined portion E can be further improved.

Since the wider gap $g_{31}$ is extended by the length $D_4$, even when the high-frequency package 10 is a little shifted in the longitudinal direction of the signal line 32B of the wiring board 30B in joining, the connection can be certainly established without occurrence of poor connections as long as the displacement is within the range of the length $D_4$. As a result, the activity of connecting the high-frequency package 10 to the wiring board 30B can be done more easily, and the frequency of occurrence of poor connections such as a short circuit can be further reduced, leading to a further improvement in mountability.

Here, in the embodiment (4), described is the case wherein the wider gap $g_{31}$ is additionally extended by the length $D_4$ in the longitudinal direction of the signal line 32B from the joined portion E, only in relation to the wiring board 30B side, but in another embodiment, the gap $g_{21}$ (see FIG. 4(b)) the width of which is set to be larger may be extended in the longitudinal direction of the signal line 15 from the joined portion E, on the high-frequency package 10 side similarly. Or, the gaps $g_{31}$ and $g_{21}$ which are set to be wider may be extended in the longitudinal direction of the signal lines 32B and 15 from the joined portion E on both of the wiring board 30B and the high-frequency package 10. Here, in this case, the sum of the length $D_4$ of the extension on the wiring board 30B side and the length $D_4$ of the extension on the high-frequency package 10 side is preferably set to be a quarter or less of the wavelength of a high-frequency signal propagating through the signal lines 32B and 15.

Figure 6A:
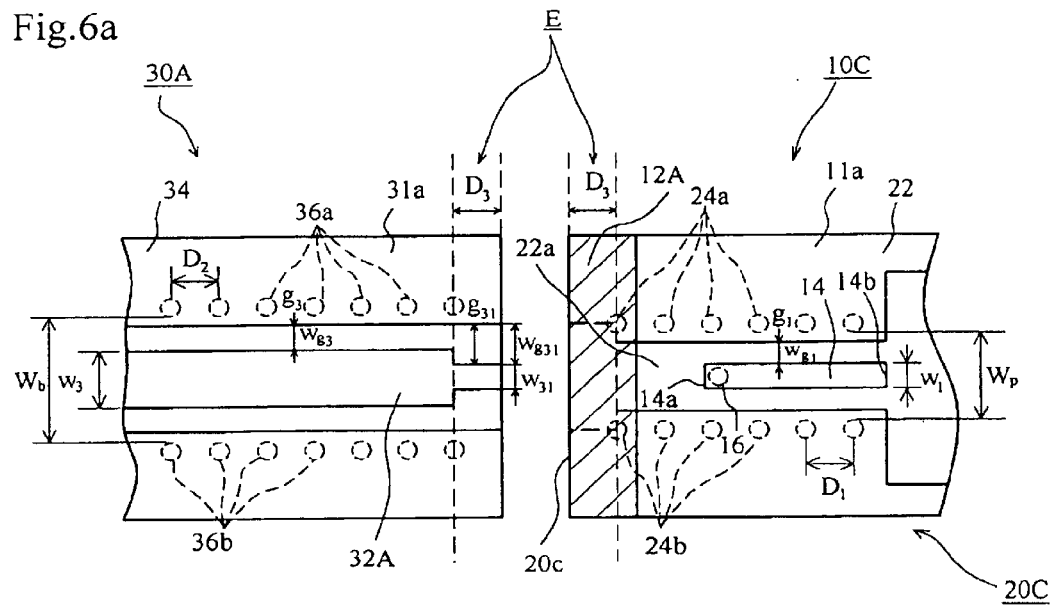
Figure 6B:
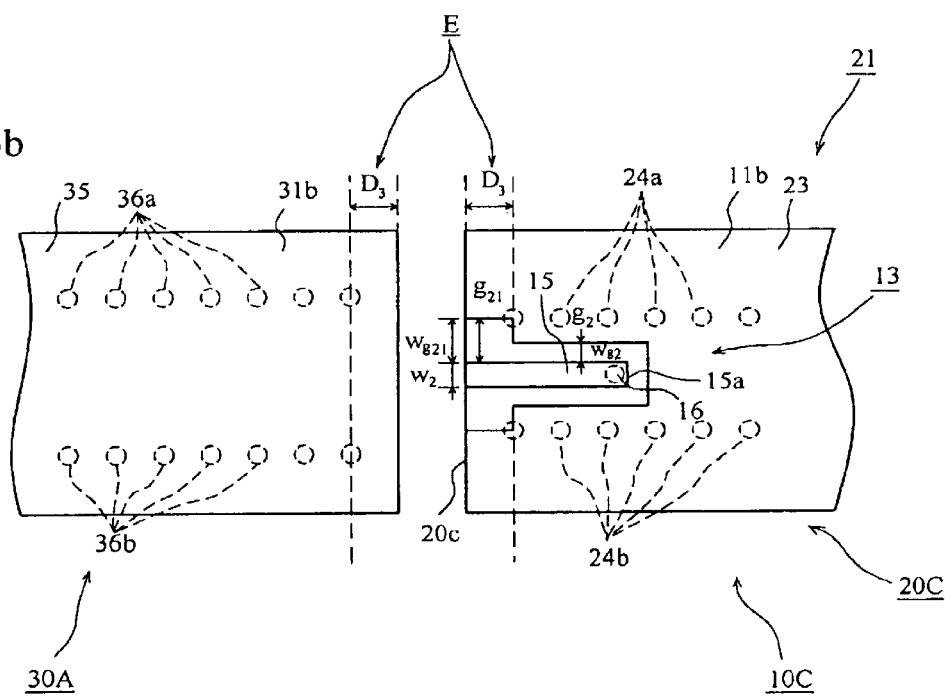
FIG. 6(b) is a bottom plan view.

A connected construction of a high-frequency package and a wiring board according to an embodiment (5) is described below. FIGS. 6 comprise enlarged exploded views schematically showing the principal parts of a high-frequency package and a wiring board for describing the connected construction of a high-frequency package and a wiring board according to the embodiment (5), wherein FIG. 6(a) is a plan view, while FIG. 6(b) is a bottom plan view. Here, the same marks are affixed to the components having the same functions as those in the embodiment (1), which are not described.

A thin-film-like signal line 14 having a width of $w_1$ is formed in a prescribed place on the dielectric substrate top surface 11a of a high-frequency transmission line substrate 20C constituting a high-frequency package 10C. A ground 22 is formed around the signal line 14 with a gap $g_1$ interposed between. They constitute a coplanar strip line.

In a region 22a between the end portion 14a on the conductive-via connecting side of the signal line 14 and one side plane 20c on the wiring-board connected side, the ground 22 is not formed. The region 22a includes at least a portion facing a signal line 15, and comprises a portion ranging from the end portion 14a on the conductive-via connecting side of the signal line 14 to $D_3$ short of the one side plane 20c on the wiring-board connected side, the width of which is set to be $(w_1+2\times w_{g1})$, and a portion ranging from the $D_3$ short of the one side plane 20c on the wiring-board connected side to the one side plane 20c on the wiring-board connected side, the width of which is set to be $(w_3+2\times w_{g3})$.

In the high-frequency package 10C, in order to certainly obtain the effect of not forming the ground 22 in the region 22a, a lid 12A is made of an insulating material such as alumina or plastic, and an adhesive such as glass or a resin is used for sealing thereof.

Or, in place of the lid 12A made of an insulating material, a frame-like wall made of the same material as that of the dielectric substrate 11 may be formed in the outer regions of the high-frequency transmission line substrate 20C by cofiring, and sealing may be done using a lid or a frame made of metal arranged on the wall. Here, in this case, in order to obtain the effect of not forming the ground 22 in the region 22a of the high-frequency package 10C with reliability, the height of the frame-like wall is preferably set to be 0.1 mm or higher, and more preferably set to be 0.2 mm or higher. When the height of the frame-like wall is less than 0.1 mm, the effect of not forming the ground 22 in the region 22a cannot be sufficiently shown because of the influence of the lid or frame made of metal, leading to insufficient impedance matching.

Since the interconnection structure on the dielectric substrate bottom surface 11b of the high-frequency transmission line substrate 20C constituting the high-frequency package 10C is almost the same as that shown in FIG. 4(b), and the construction of the wiring board 30A is also the same as that shown in FIG. 4, the detailed descriptions thereof are not included here.

In the connected construction of the high-frequency package 10C and the wiring board 30A as stated above, a high-frequency signal (not shown) is input and output in the same manner as in the connected construction of the high-frequency package 10 and the wiring board 30 according to the embodiment (1).

Using the connected construction of the high-frequency package 10C and the wiring board 30A according to the embodiment (5), since no ground 22 is formed in the region 22a between the end portion 14a on the conductive-via connecting side of the signal line 14 and the one side plane 20c on the wiring-board connected side, the capacitive component between the signal line 15 and the ground 22, and that between the signal line 32A and the ground 22 can be made smaller. Particularly, the degradation of the transmission characteristic in a high-frequency region can be prevented and the impedances can be matched across a much higher frequency region, leading to the realization of a connected construction having an excellent transmission characteristic.

When the lid 12A is made of an insulating material, the effect of preventing the degradation of the transmission characteristic in a high-frequency region, which can be obtained by not forming the ground 22 in the region 22a, can be obtained with reliability.

EXAMPLES AND COMPARATIVE EXAMPLES

The results of transmission characteristics (insertion losses $S_{21}$) and reflection characteristics (return losses $S_{11}$) examined with the below-described conditions using high-frequency packages and wiring boards according to Examples are described below.

In Examples 1 and 2, the transmission characteristics (insertion losses $S_{21}$) and reflection characteristics (return losses $S_{11}$) in the connected constructions of a high-frequency package 10 and a wiring board 30 according to the embodiment (1) were examined.

A construction wherein no conductive vias 36a and 36b of a wiring board were formed was selected as Comparative Example 1, a construction wherein no conductive vias 24a and 24b of a high-frequency package were formed was selected as Comparative Example 2, and a construction wherein neither conductive vias 24a and 24b of a high-frequency package nor conductive vias 36a and 36b of a wiring board were formed was selected as Comparative Example 3, and the transmission characteristics (insertion losses $S_{21}$) and reflection characteristics (return losses $S_{11}$) in the connected constructions of a high-frequency package and a wiring board were examined.

The transmission characteristics (insertion losses $S_{21}$) and reflection characteristics (return losses $S_{11}$) in each of the above connected constructions were analyzed by three-dimensional electromagnetic field simulations using the TLM (Transmission Line Modeling) method.

The thickness $T_1$ of a dielectric substrate 11 of a high-frequency package 10, the dielectric constant $\epsilon_{r1}$ thereof, the widths $w_1$ and $w_2$ of signal lines 14 and 15, a gap $g_1$ between the signal line 14 and a ground 22, and a gap $g_2$ between the signal line 15 and a ground 23, the thickness $T_2$ of a dielectric substrate 31 of a wiring board 30, the dielectric constant $\mathring{a}_{r2}$ thereof, the width $w_3$ of a signal line 32 and a gap $g_3$ between the signal line 32 and a ground 34 according to Examples 1 and 2, and Comparative Examples 1–3, respectively, are shown in Table 1.

TABLE 1

| Item<br>Unit | T<br>mm | $\epsilon_{r1}$ | $T_2$<br>mm | $\epsilon_{r2}$ | $w_1$<br>mm | $w_2$<br>mm | $w_3$<br>mm | $g_1$<br>mm | $g_2$<br>mm | $g_3$<br>mm |
|---|---|---|---|---|---|---|---|---|---|---|
| Example 1 | 0.30 | 8.90 | 0.20 | 8.90 | 0.25 | 0.28 | 0.20 | 0.20 | 0.30 | 0.28 |
| Example 2 | 0.20 | 8.90 | 0.20 | 8.90 | 0.10 | 0.14 | 0.15 | 0.06 | 0.08 | 0.11 |
| Comparative Example 1 | 0.30 | 8.90 | 0.20 | 8.90 | 0.25 | 0.28 | 0.20 | 0.20 | 0.30 | 0.28 |
| Comparative Example 2 | 0.30 | 8.90 | 0.20 | 8.90 | 0.25 | 0.28 | 0.20 | 0.20 | 0.30 | 0.28 |
| Comparative Example 3 | 0.30 | 8.90 | 0.20 | 8.90 | 0.25 | 0.28 | 0.20 | 0.20 | 0.30 | 0.28 |

The distance $W_p$ between conductive vias 24a and 24b of the high-frequency package 10, and the distance $W_b$ between conductive vias 35a and 35b of the wiring board 30 according to Examples 1 and 2, and Comparative Examples 1–3, respectively, are shown in Table 2. Here, the width $D_3$ of a joined portion was set to be 0.3 mm in Example 1 and Comparative Examples 1–3, and 0.2 mm in Example 2.

TABLE 2

| Item | $W_p$ (mm)<br>Setting | $W_b$ (mm)<br>Setting |
|---|---|---|
| Example 1 | 1.04 | 1.04 |
| Example 2 | 0.61 | 0.61 |
| Comparative Example 1 | 1.04 | — |
| Comparative Example 2 | — | 1.04 |
| Comparative Example 3 | — | — |

Figure 7:
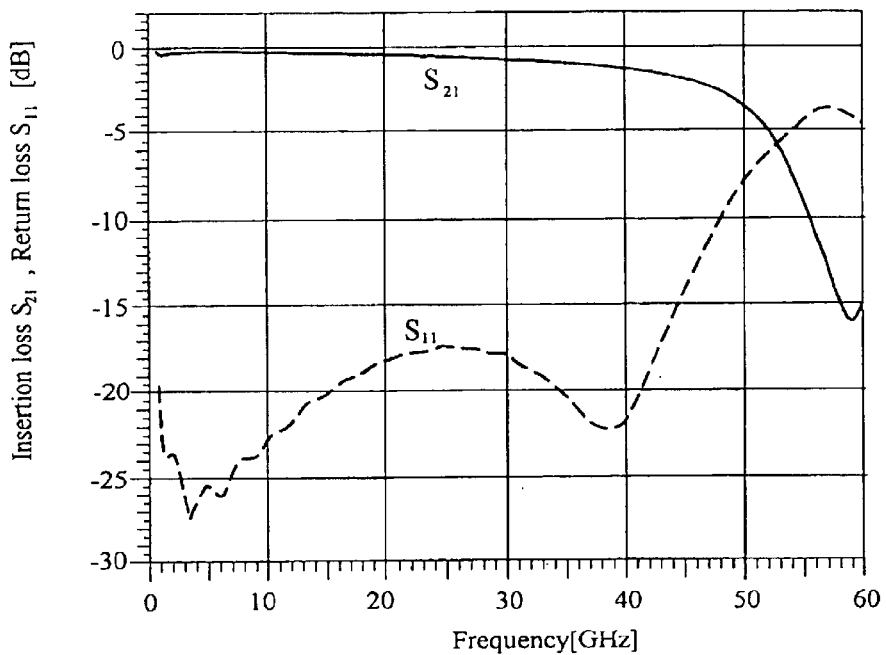
FIG. 7 is a graph indicating the simulation results of a connected construction of a high-frequency package and a wiring board according to Example 1.

By performing a simulation with the conditions in Example 1 and carrying out an analysis thereof, the transmission characteristic (insertion loss $S_{21}$) and reflection characteristic (return loss $S_{11}$) shown in FIG. 7 were obtained. As is obvious from FIG. 7, in the connected construction of a high-frequency package and a wiring board according to Example 1, the transmission characteristic (insertion loss $S_{21}$) and reflection characteristic (return loss $S_{11}$) were excellent, which were $S_{21}>-1.0$ dB and $S_{11}<-18$ dB, up to nearly over 40 GHz, where the distance between via rows has an influence on the characteristics.

Figure 8:
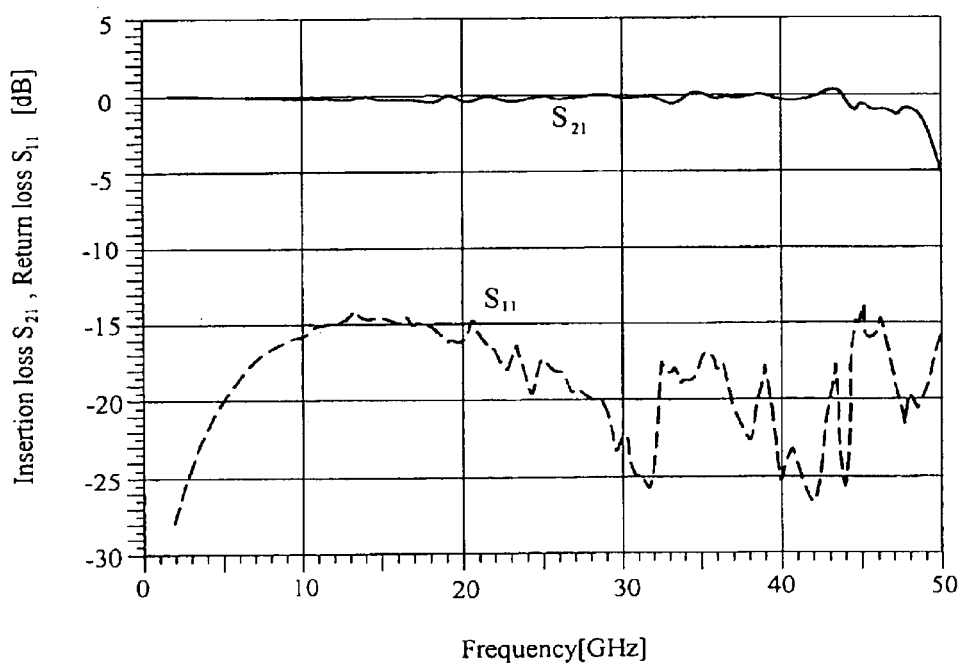
FIG. 8 is a graph indicating the measurement results of the connected construction of a high-frequency package and a wiring board according to the Example 1 using a network analyzer.

FIG. 8 shows the measurement results of the transmission characteristic (insertion loss $S_{21}$) and reflection characteristic (return loss $S_{11}$) in the connected construction of a high-frequency package and a wiring board by preparing a sample which satisfied the conditions in Example 1 and using a network analyzer. As is obvious from FIG. 8, no ripples were observed up to about 48 GHz, and the transmission characteristic (insertion loss $S_{21}$) and reflection characteristic (return loss $S_{11}$) were excellent up to about 48 GHz, which were $S_{21}>-1.5$ dB and $S_{11}<-18$ dB.

Figure 9:
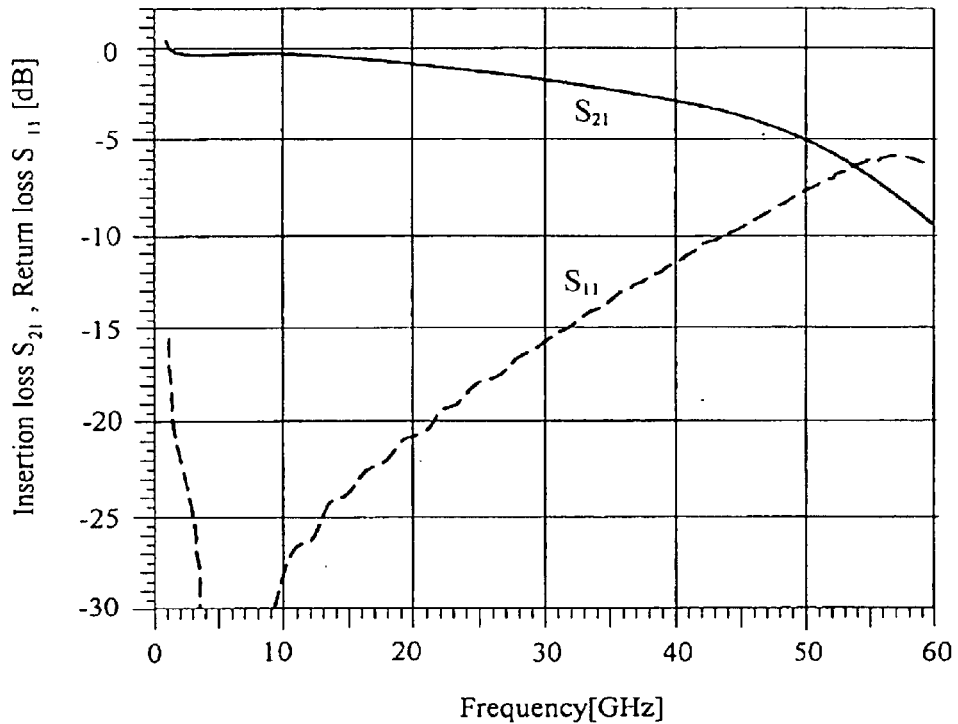
FIG. 9 is a graph indicating the simulation results of a connected construction of a high-frequency package and a wiring board according to Comparative Example 1.

FIG. 9 shows the transmission characteristic (insertion loss $S_{21}$) and reflection characteristic (return loss $S_{11}$) obtained by performing a simulation with the conditions in Comparative Example 1 and carrying out an analysis thereof. In Comparative Example 1 wherein only the high-frequency package had conductive-via rows, the insertion loss $S_{21}$ tended to increase gradually from a low-frequency band. The insertion loss $S_{21}$ reached $-3.0$ dB at about 40 GHz, where the transmission characteristic began to be degraded.

Figure 10:
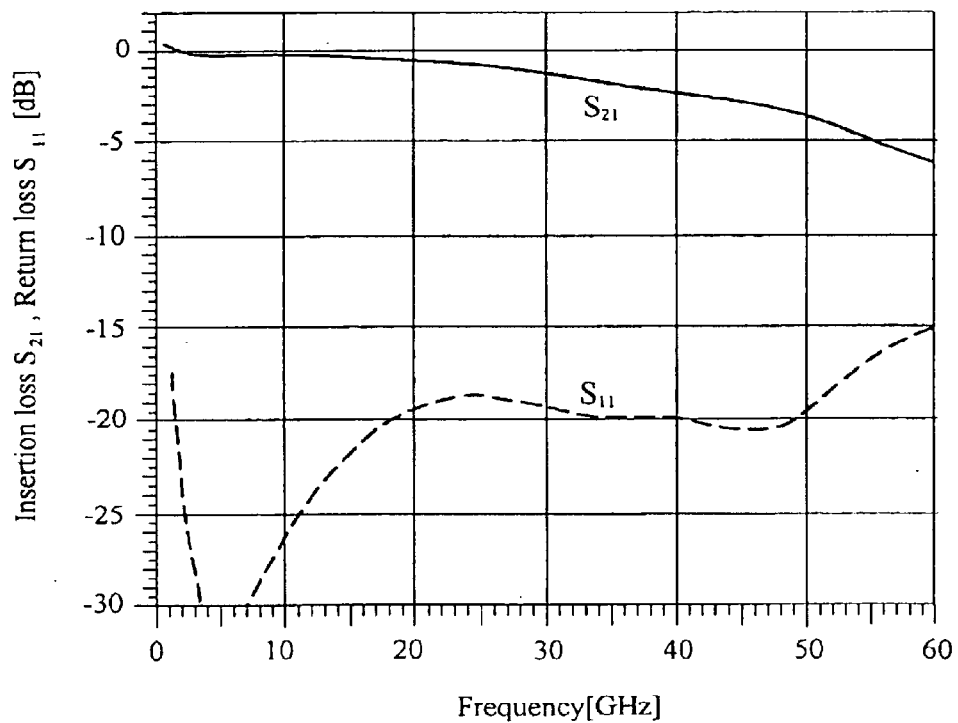
FIG. 10 is a graph indicating the simulation results of a connected construction of a high-frequency package and a wiring board according to Comparative Example 2.

FIG. 10 shows the transmission characteristic (insertion loss $S_{21}$) and reflection characteristic (return loss $S_{11}$) obtained by performing a simulation with the conditions in Comparative Example 2 and carrying out an analysis thereof. In Comparative Example 2 wherein only the wiring board had conductive-via rows, the insertion loss $S_{21}$ became larger gradually from a low-frequency band, like in Comparative Example 1. The insertion loss $S_{21}$ reached $-2.5$ dB at about 40 GHz, where the transmission characteristic began to be degraded.

Figure 11:
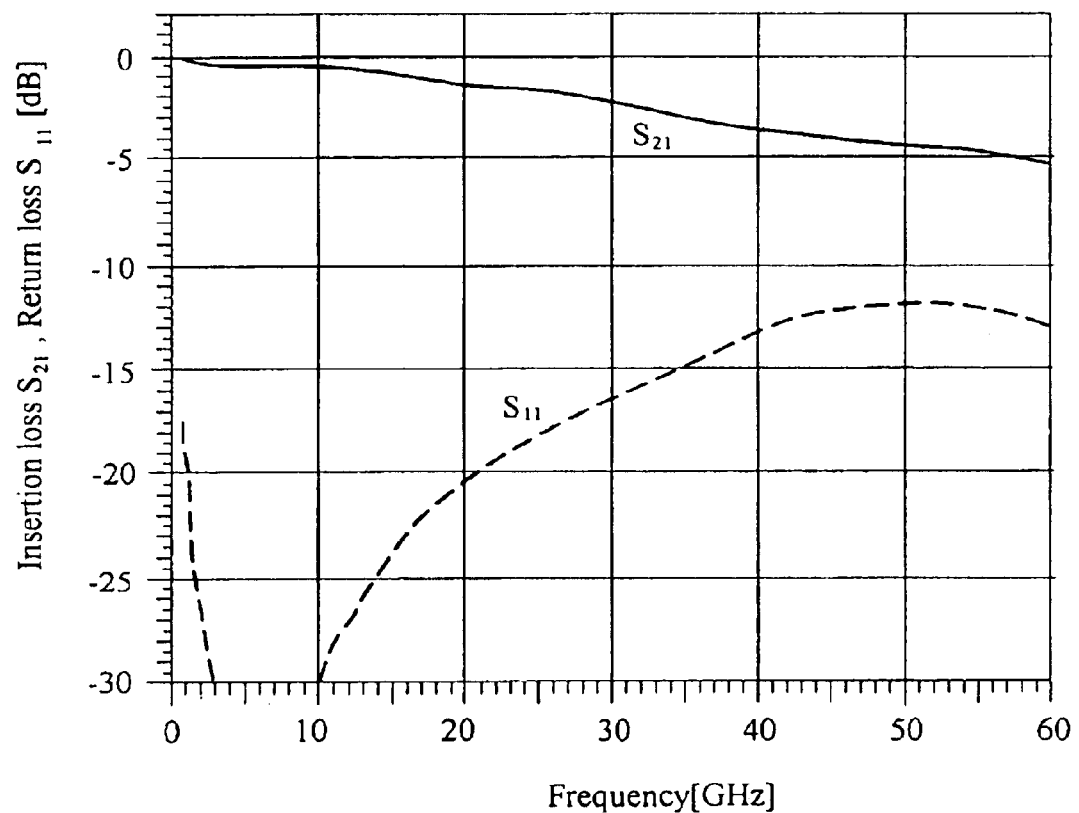
FIG. 11 is a graph indicating the simulation results of a connected construction of a high-frequency package and a wiring board according to Comparative Example 3.

FIG. 11 shows the transmission characteristic (insertion loss $S_{21}$) and reflection characteristic (return loss $S_{11}$) obtained by performing a simulation with the conditions in Comparative Example 3 and carrying out an analysis thereof. In Comparative Example 3 wherein neither the high-frequency package nor the wiring board had conductive-via rows, the insertion loss $S_{21}$ tended to increase from a low-frequency band more remarkably than in Comparative Examples 1 and 2. Significant degradation of the transmission characteristic was observed.

Figure 12:
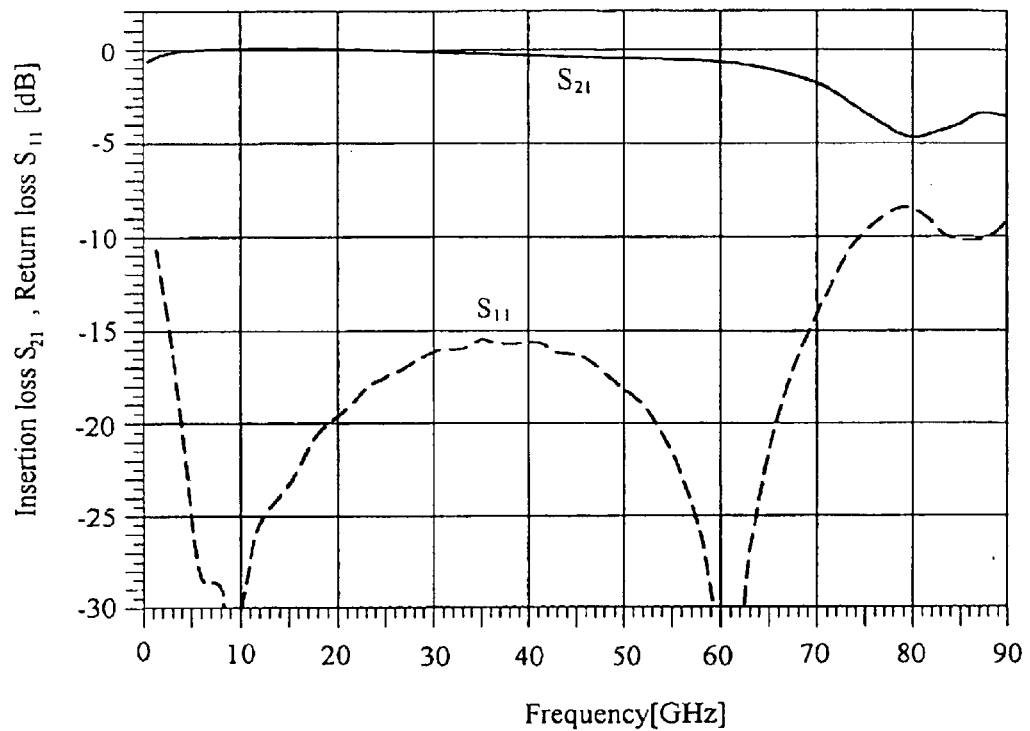
FIG. 12 is a graph indicating the simulation results of a connected construction of a high-frequency package and a wiring board according to Example 2.

FIG. 12 shows the transmission characteristic (insertion loss $S_{21}$) and reflection characteristic (return loss $S_{11}$) obtained by performing a simulation with the conditions in Example 2 and carrying out an analysis thereof. In Example 2, the condition $W_p=W_b=0.61$ mm was adopted so as to cope with higher frequencies. As is obvious from FIG. 12, in the construction between a high-frequency package and a wiring board according to Example 2, the transmission characteristic (insertion loss $S_{21}$) and reflection characteristic (return loss $S_{11}$) were excellent at about 70 GHz or below, which were $S_{21}>-2.0$ dB and $S_{11}<-14$ dB.

Figure 13:
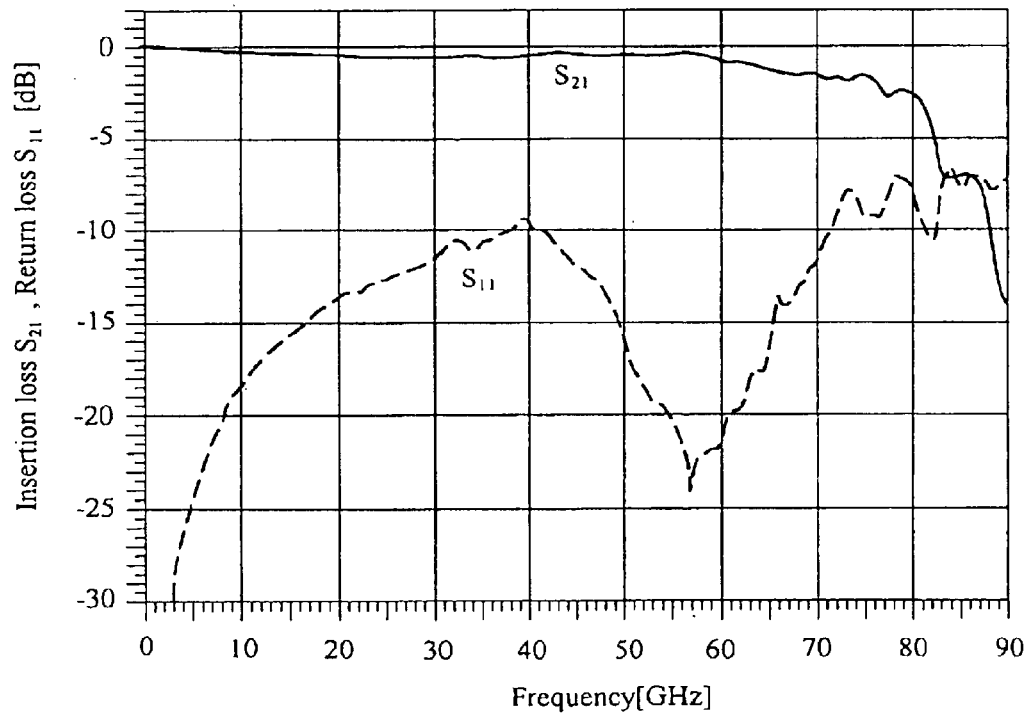
FIG. 13 is a graph indicating the measurement results of the connected construction of a high-frequency package and a wiring board according to the Example 2 using a network analyzer.

FIG. 13 shows the measurement results of the transmission characteristic (insertion loss $S_{21}$) and reflection characteristic (return loss $S_{11}$) in the connected construction of a high-frequency package and a wiring board by preparing a sample which satisfied the conditions in Example 2 and using a network analyzer. Although the return loss $S_{11}$ had a tendency to be degraded a little more than the simulation results shown in FIG. 12, the insertion loss $S_{21}$ had no outstanding ripples in all of the frequency bands ranging from 0 to about 82 GHz. The transmission loss was reduced and the transmission characteristic was excellent.

Connected constructions of a high-frequency package and a wiring board according to Examples 3–6 are described below.

In Example 1, the case of the width $D_3$ of the joined portion E being set to be 0.3 mm was described. In Examples 3–5, the transmission characteristics in the cases of various widths $D_3$ of the joined portion E of 0.2 mm, 0.3 mm, 0.4 mm and 0.5 mm were examined in order to obtain further knowledge of the influence of the width $D_3$ on the transmission characteristic and reflection characteristic in the joined portion E.

In Examples 3, 4 and 5, a connected construction of a high-frequency package 10 and a wiring board 30 according to the embodiment (1), that of a high-frequency package 10B and a wiring board 30A according to the embodiment (3), and that of a high-frequency package 10 and a wiring board 30B according to the embodiment (4) were used, respectively.

In Example 6, using a connected construction of a high-frequency package 10C and a wiring board 30A according to the embodiment (5) with the width $D_3$ of the joined portion E of 0.3 mm, the comparison with Example 4 was carried out.

The transmission characteristic (insertion loss $S_{21}$) and reflection characteristic (return loss $S_{11}$) in each of the connected constructions of Examples 3–6 were analyzed by three-dimensional electromagnetic field simulations using the TLM method.

The thickness $T_1$ of a dielectric substrate 11 of the high-frequency package 10, 10B or 10C, the dielectric constant $\in_{r1}$ thereof, the widths $w_1$ and $w_2$ of signal lines 14 and 15, the width $w_{g1}$ of a gap $g_1$ between the signal line 14 and a ground 22, and the width $w_{g2}$ of a gap $g_2$ between the signal line 15 and a ground 23, the width $w_{g21}$ of a gap $g_{21}$ in the joined portion E, the thickness $T_2$ of a dielectric substrate 31 of the wiring board 30, 30A or 30B, the dielectric constant $\in_{r2}$ thereof, the width $w_3$ of a signal line 32, 32A or 32B, the width $w_{31}$ of the signal line 32, 32A or 32B in the joined portion E, the width $w_{g3}$ of a gap $g_3$ between the signal line 32, 32A or 32B and a ground 34, and the width $w_{g31}$ of a gap $g_{31}$ in the joined portion E according to Examples 3–6, respectively, are shown in Table 3.

The distance $W_p$ between conductive vias 24a and 24b of the high-frequency package 10, 10B or 10C, and the distance $W_b$ between conductive vias 35a and 35b of the wiring board 30, 30A or 30B according to Examples 3–6, respectively, are shown in Table 4. Here, in Examples 3–6, the interval $D_1$ between the conductive vias 24a and 24a, or 24b and 24b, was set to be 0.35 mm, while the interval $D_2$ between the conductive vias 36a and 36a, or 36b and 36b, was set to be 0.70 mm.

TABLE 4

| Item | $W_p$ (mm) Setting | $W_b$ (mm) Setting |
|---|---|---|
| Example 3 | 0.84 | 1.20 |
| Example 4 | 0.84 | 1.20 |
| Example 5 | 0.84 | 1.20 |
| Example 6 | 0.84 | 1.20 |

Figure 14:
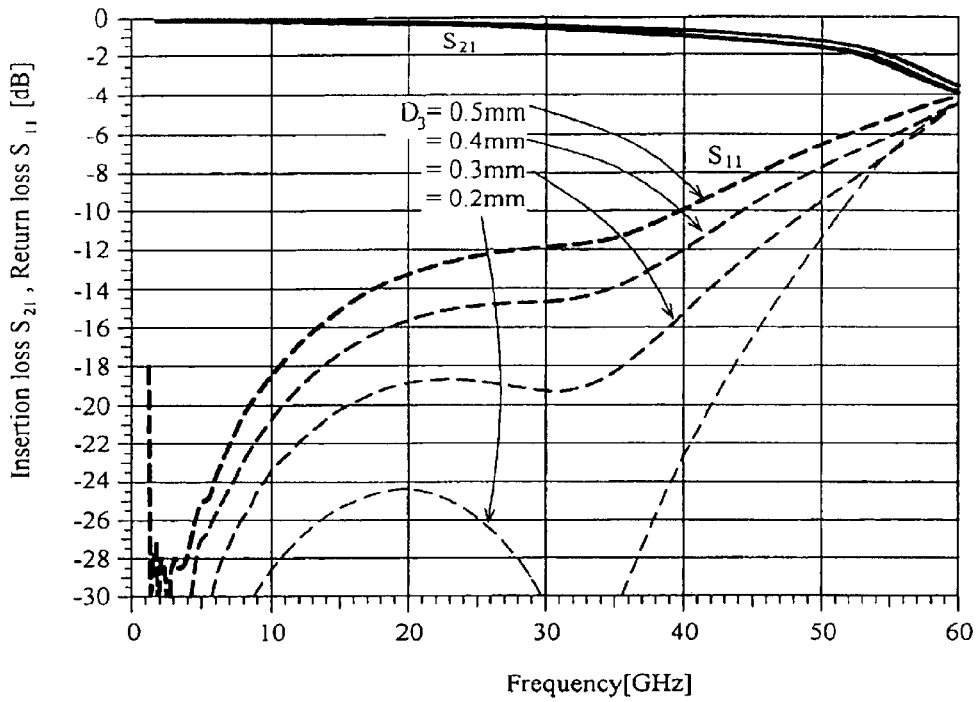
FIG. 14 is a graph indicating the simulation results of a connected construction of a high-frequency package and a wiring board according to Example 3.

By performing a simulation with the conditions in Example 3 and carrying out an analysis thereof, the transmission characteristic (insertion loss $S_{21}$) and reflection characteristic (return loss $S_{11}$) as shown in FIG. 14 were obtained. As is obvious from FIG. 14, in the connected construction of a high-frequency package and a wiring board according to Example 3, as the width $D_3$ was increased from 0.2 mm to 0.5 mm, the return loss $S_{11}$ in an intermediate-frequency band of 50 GHz or less had a tendency to increase. This is seemingly because the return loss $S_{11}$ in the joined portion E becomes larger as the width $D_3$ of the joined portion E becomes larger, leading to difficulty in impedance matching. However, in a frequency band of 40 GHz or less, both of the transmission characteristic (insertion loss $S_{21}$) and the reflection characteristic (return loss $S_{11}$) were preferable, which were $S_{21}>-1.0$ dB and $S_{11}<-10$ dB.

Figure 15:
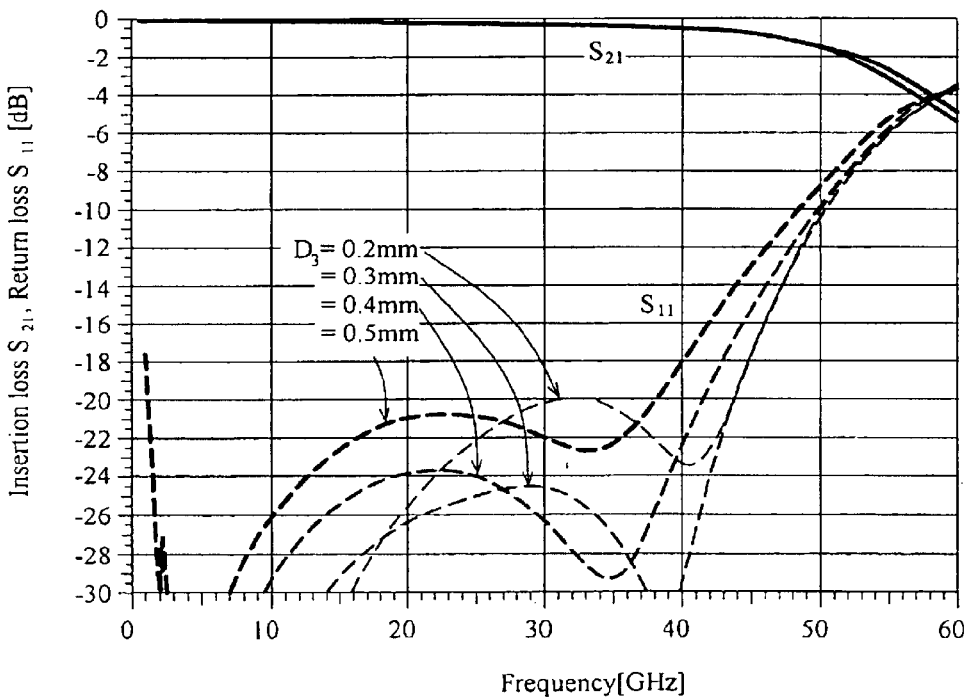
FIG. 15 is a graph indicating the simulation results of a connected construction of a high-frequency package and a wiring board according to Example 4.

FIG. 15 shows the transmission characteristic (insertion loss $S_{21}$) and reflection characteristic (return loss $S_{11}$) obtained by performing a simulation with the conditions in Example 4 and carrying out an analysis thereof.

In Example 4 wherein the widths $w_{g21}$ and $w_{g31}$ of gaps $g_{21}$ and $g_{31}$ in the joined portion E were set to be larger than the widths $w_{g2}$ and $w_{g3}$ of gaps $g_2$ and $g_3$, even if the width $D_3$ of the joined portion E was increased from 0.2 mm to 0.5 mm, an increase tendency of the return loss $S_{11}$ in an intermediate-frequency band of 40 GHz or less like in Example 3 was not observed. The transmission characteristic (insertion loss $S_{21}$) and reflection characteristic (return loss $S_{11}$) were extremely excellent in any case, which were $S_{21}>-0.5$ dB and $S_{11}<-20$ dB.

Here, in Example 4, a portion wherein the conductive vias 24a and 24b in the joined portion E were not covered with the ground 23 was generated because of setting the width $w_{g21}$ of the gap $g_{21}$ of the high-frequency package 10B in the joined portion E to be 0.395 mm. But it is not preferable to make the distance $W_p$ between the conductive vias 24a and 24b in this portion larger so that the conductive vias 24a and 24b can be covered by the ground 23, since the highest signal frequency a signal of which can be transmitted becomes lower.

Figure 16:
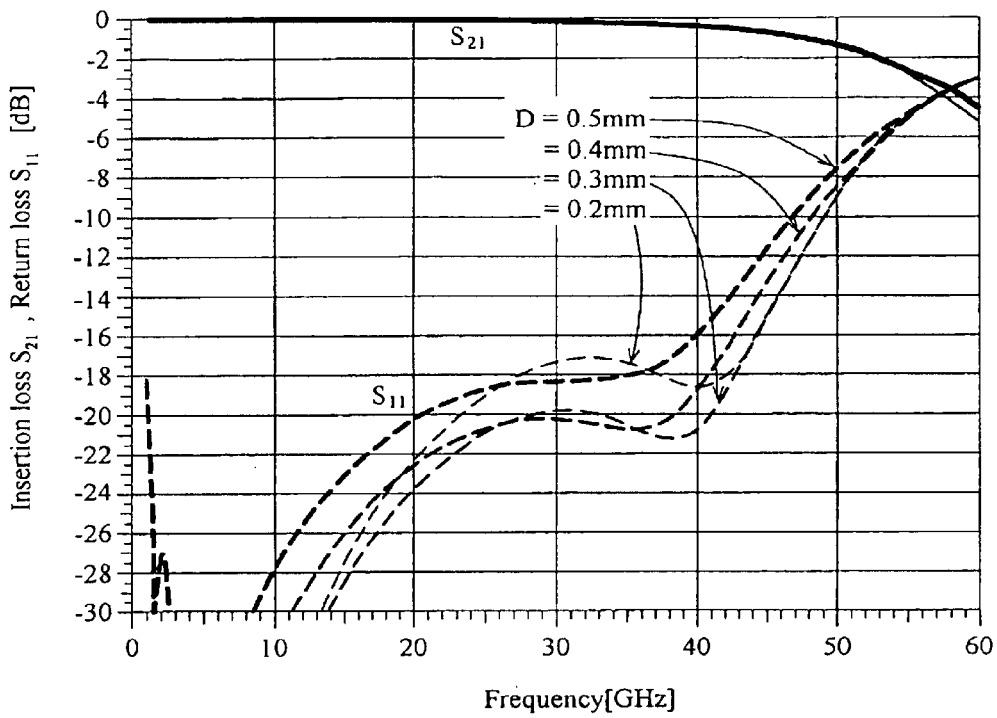
FIG. 16 is a graph indicating the simulation results of a connected construction of a high-frequency package and a wiring board according to Example 5.

FIG. 16 shows the transmission characteristic (insertion loss S21) and reflection characteristic (return loss $S_{11}$)

TABLE 3

| Item Unit | T mm | $\in_{r1}$ | $T_2$ mm | $\in_{r2}$ | $w_1$ mm | $w_2$ mm | $w_3$ mm | $w_{31}$ mm | $g_1$ mm | $g_2$ mm | $g_3$ mm | $w_{g21}$ mm | $w_{g31}$ mm |
|---|---|---|---|---|---|---|---|---|---|---|---|---|---|
| Example 3 | 0.30 | 9.50 | 0.20 | 3.38 | 0.25 | 0.25 | 0.46 | — | 0.21 | 0.21 | 0.29 | — | — |
| Example 4 | 0.30 | 9.50 | 0.20 | 3.38 | 0.25 | 0.25 | 0.46 | 0.25 | 0.21 | 0.21 | 0.29 | 0.395 | 0.395 |
| Comparative Example 5 | 0.30 | 9.50 | 0.20 | 3.38 | 0.25 | 0.25 | 0.46 | 0.25 | 0.21 | 0.21 | 0.29 | — | 0.395 |
| Comparative Example 6 | 0.30 | 9.50 | 0.20 | 3.38 | 0.25 | 0.25 | 0.46 | 0.25 | 0.21 | 0.21 | 0.29 | 0.395 | 0.395 | obtained by performing a simulation with the conditions in Example 5 and carrying out an analysis thereof.

In Example 5 wherein a gap $g_{31}$ having a width of $w_{g31}$ was formed in both a joined portion E and a region F (set to be $D_4$=0.2 mm) on the wiring board 30B, even if the width $D_3$ of the joined portion E was increased from 0.2 mm to 0.5 mm, the variations both in transmission characteristic and in reflection characteristic were small in an intermediate-frequency band of 40 GHz or less. The transmission characteristic (insertion loss $S_{21}$) and reflection characteristic (return loss $S_{11}$) were excellent in any case, which were $S_{21}$>−0.5 dB and $S_{11}$<−16 dB.

Compared with Example 4, the reflection characteristic was a little more degraded in Example 5, wherein the return loss $S_{11}$ became larger by about 3 dB–5 dB. As a factor thereof, the following can be considered.

In Example 5, since the width $w_{g2}$ of the gap $g_2$ of the high-frequency package 10 in the joined portion E was smaller by 0.185 mm than the width $w_{g31}$ of the gap $g_{31}$ of the wiring board 30B, the impedance in the joined portion E was lower than that in Example 4. On the other hand, in Example 5, since the width $w_{g31}$ of the gap $g_{31}$ of the wiring board 30B in the region F was set to be large, which was 0.395 mm, the decrease in impedance of the signal line 32B in the region F could be held down. However, it appears that the reflection characteristic was slightly degraded in Example 5 because of the influence of an increased discontinuous portion of the impedance of the signal line 32B, compared with in Example 4.

Figure 17:
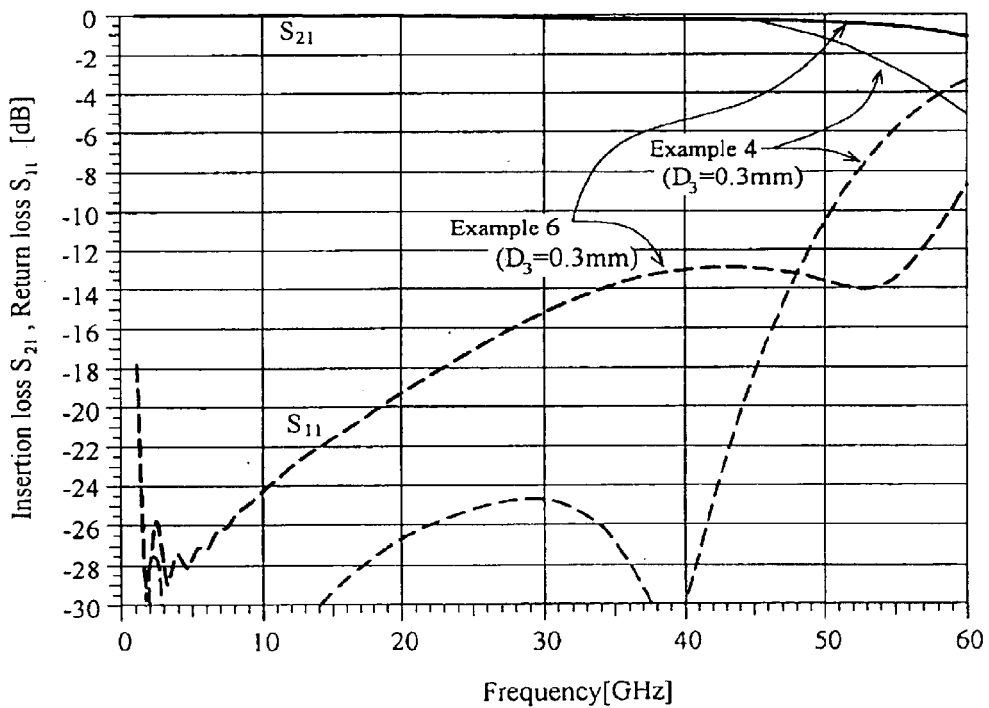
FIG. 17 is a graph indicating the simulation results of a connected construction of a high-frequency package and a wiring board according to Example 6.
Figure 18A:
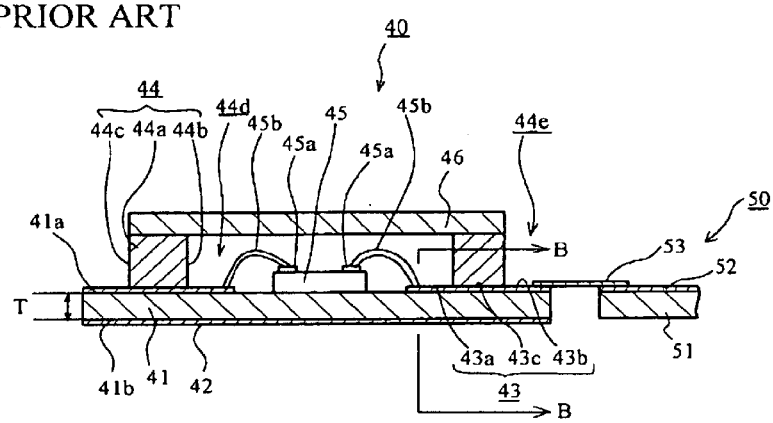
Figure 18B:
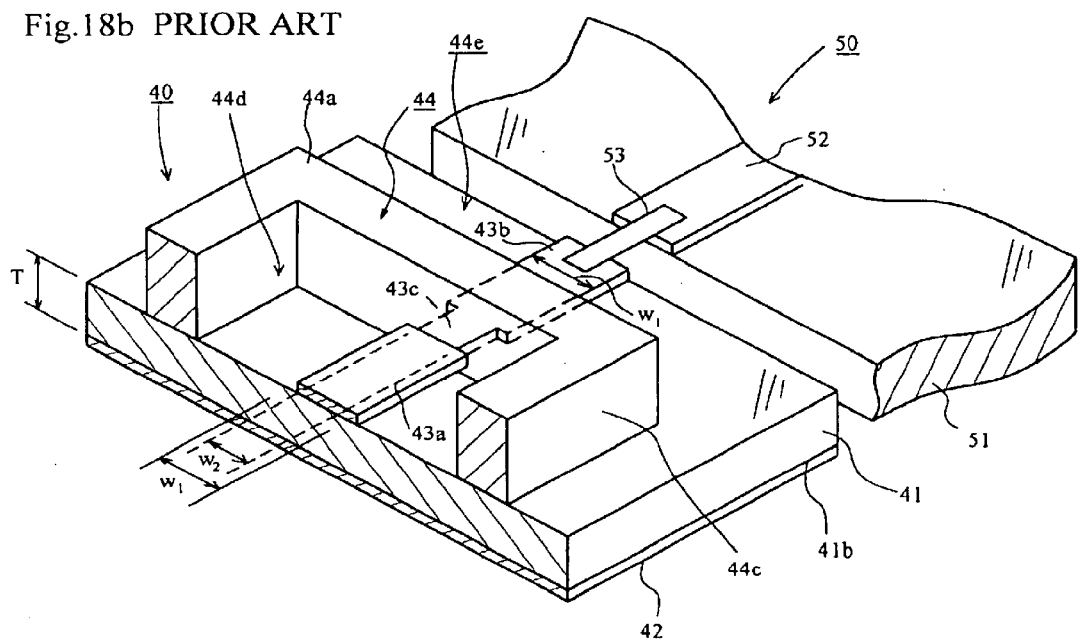
FIG. 18(b) is a sectional perspective view along line B—B.
Figure 19:
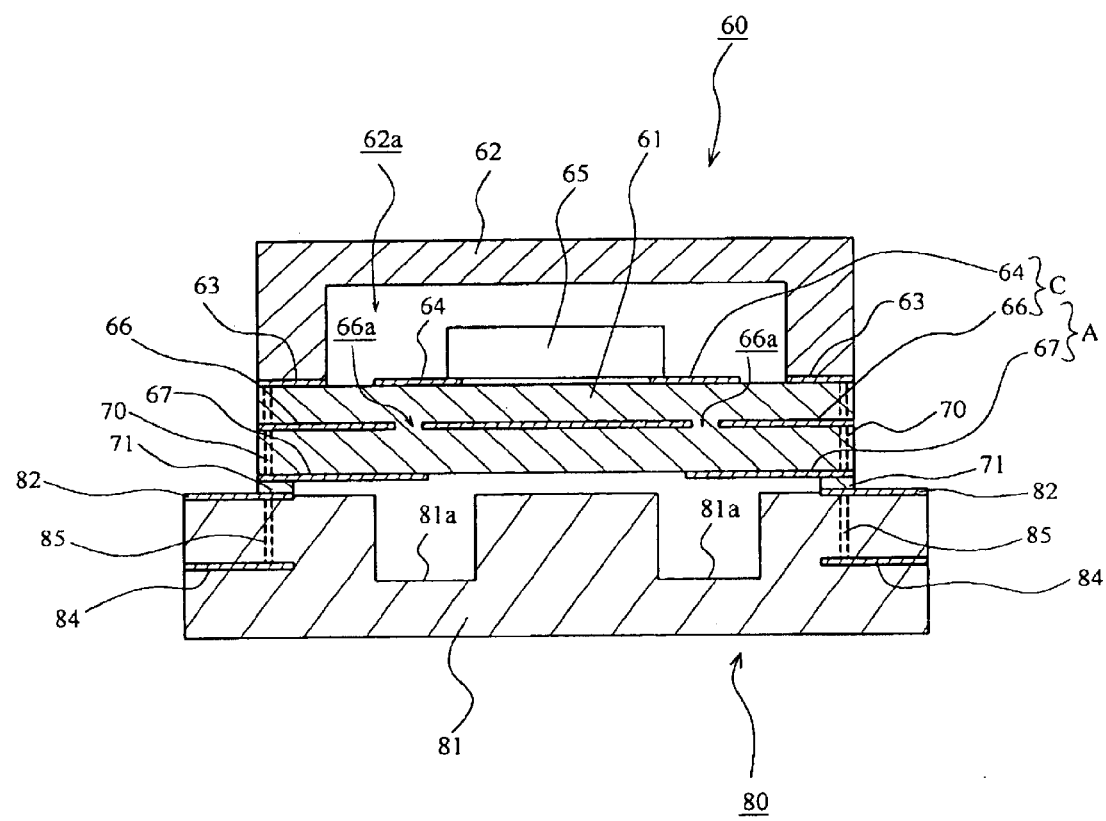
FIG. 19 is a sectional side view schematically showing another conventional connected construction of a high-frequency package and a wiring board.
Figure 20A:
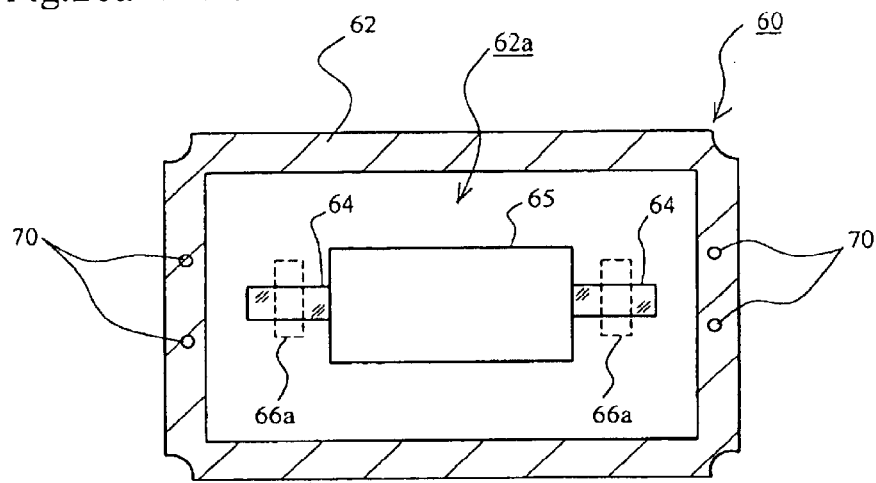
FIG. 20(a) is a top plan view of the high-frequency package.
Figure 20B:
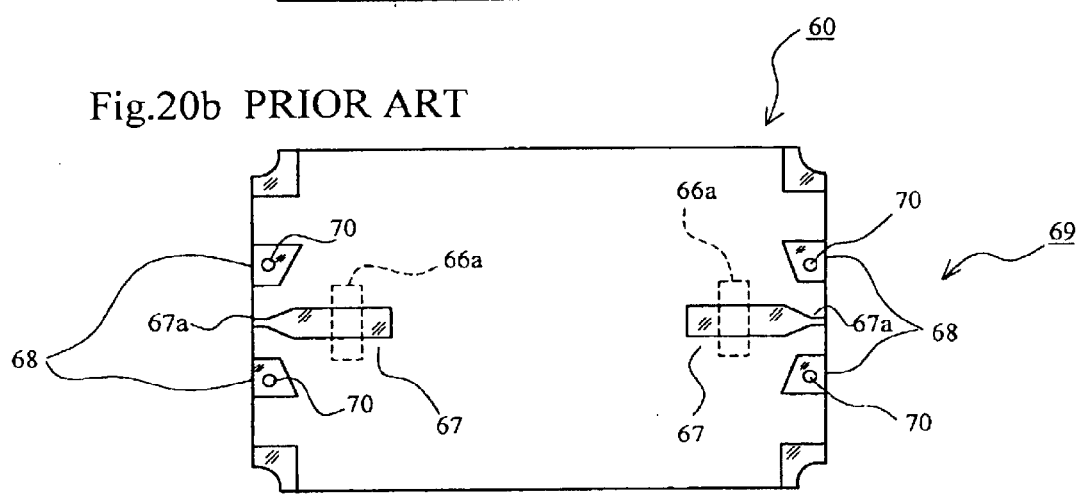
FIG. 20(b) is a bottom plan view thereof.
Figure 20C:
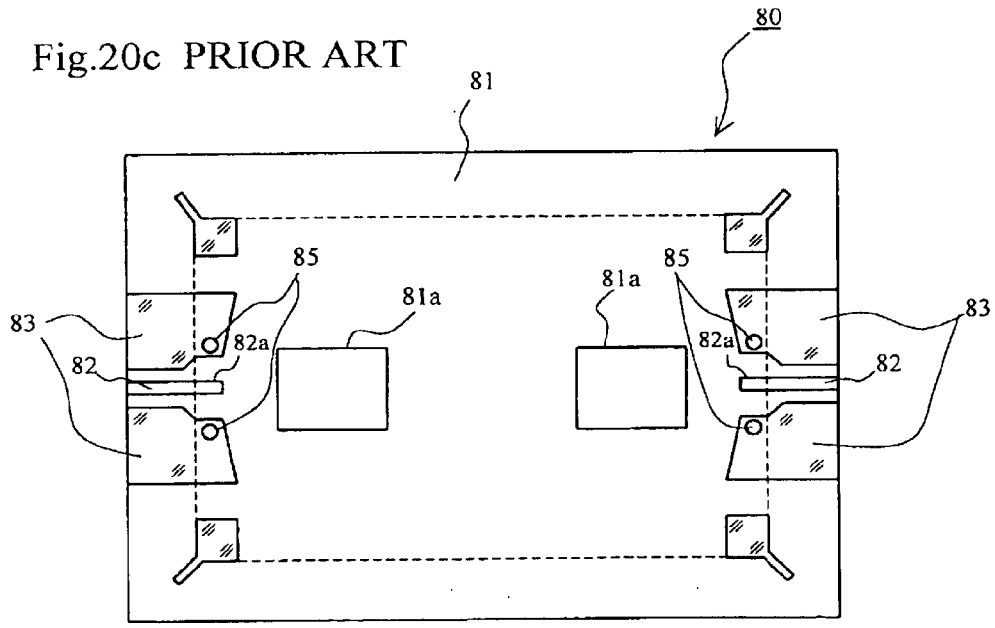
FIG. 20(c) is a top plan view of the wiring board.

FIG. 17 shows the transmission characteristic (insertion loss $S_{21}$) and reflection characteristic (return loss $S_{11}$) obtained by performing a simulation with the conditions in Example 6 and carrying out an analysis thereof.

In Example 6 wherein a high-frequency package 10C with no ground 22 being formed in a region 22a was used, the return loss $S_{11}$ at 48 GHz or less was larger than that in Example 4, but the insertion losses $S_{21}$ in both cases were $S_{21}$>−1.0 dB. On the other hand, in a higher frequency band over 48 GHz, the return loss $S_{11}$ in Example 6 was smaller than that in Example 4, and the insertion loss $S_{21}$ was $S_{21}$>−1.5 dB up to 60 GHz. The transmission characteristic (insertion loss $S_{21}$) and reflection characteristic (return loss $S_{11}$) in Example 6 were excellent on a higher frequency side.

As is obvious from the above results, in the connected constructions of a high-frequency package and a wiring board according to Examples 1–6, since the distance between the conductive-via rows of the high-frequency package and the distance between the conductive-via rows of the wiring board were set in consideration of the dielectric constant of the dielectric substrate and that of the wiring board, it was possible to suppress the degradation of the transmission characteristic (insertion loss $S_{21}$) in the connection, leading to an excellent high-frequency transmission characteristic.

In Example 4, by setting the width $w_{g21}$ of the gap $g_{21}$ of the high-frequency package 10B and the width $w_{g31}$ of the gap $g_{31}$ of the wiring board 30A in the joined portion E to be larger than the widths $w_{g2}$ and $w_{g3}$ of the gaps $g_2$ and $g_3$ except in the joined portion E, the decrease in impedance of the signal lines 15 and 32 in the joined portion E could be held down, so that the impedance matching in the joined portion E could be further improved. Particularly, the increase in return loss $S_{11}$ in an intermediate-frequency band could be further held down, leading to a further improvement in transmission characteristic.

In Example 5, by additionally extending a region of the gap $g_{31}$ which was set to be wider by the length $D_4$ in the longitudinal direction of the signal line 32B from the joined portion E on the wiring board 30B, the decrease in impedance of the signal line 32B was held down, so that the impedance matching between the signal lines 15 and 32B in the joined portion E was improved.

In Example 6, by using the high-frequency package 10C wherein no ground 22 was formed in the region 22a, the decrease in impedance related to the signal line 15 on a higher frequency side was held down, so that the impedance matching in the joined portion E was improved and particularly, the degradation of the transmission characteristic in a high-frequency region was prevented.

What is claimed is:

1. A connected construction of a high-frequency package and a wiring board, wherein:

both a first distance, between first conductive-via rows to connect first grounds formed on both main surfaces of a high-frequency transmission line substrate constituting a high-frequency package, and a second distance, between second conductive-via rows to connect second grounds formed on both main surfaces of a wiring board on which the high-frequency package is mounted, are set in consideration of the dielectric constant of the high-frequency transmission line substrate and the dielectric constant of the wiring board in order to improve the high-frequency transmission characteristic between the high-frequency transmission line substrate and the wiring board.

2. A connected construction of a high-frequency package and a wiring board according to claim 1, wherein $W_p$ and $W_b$ are set in the range of $$W_p < \lambda_0/(2 \times \epsilon_{r1}^{1/2}), \text{ and}$$

$$W_b < \lambda_0/(2 \times \epsilon_{r2}^{1/2}),$$

where $\epsilon_{r1}$ is the dielectric constant of the high-frequency transmission line substrate, $\epsilon_{r2}$ is the dielectric constant of the wiring board, $\lambda_0$ is the wavelength in a vacuum of a high-frequency signal propagating through signal lines, $W_p$ is the distance between the first conductive-via rows, and $W_b$ is the distance between the second conductive-via rows.

3. A connected construction of a high-frequency package and a wiring board according to claim 2, comprising:

the high-frequency package, which has, first signal lines, and first gaps interposed between the first signal lines and the first ground on one main surface side of the high-frequency transmission line substrate, and second signal lines, one end of the second signal line being joined to the wiring board and the other end of the second signal line being connected to the first signal line through a third conductive via, and second gaps interposed between the second signal lines and the first ground on the other main surface side of the high-frequency transmission line substrate; and the wiring board, which has, a third signal line, and a third gap interposed between the third signal line and the second ground on the joined surface side to the high-frequency package;

wherein the width of the second gap in a joined portion of the high-frequency package to the wiring board is set to be larger than the width of the second gap except in the joined portion, and/or the width of the third gap in the joined portion is set to be larger than the width of the third gap except in the joined portion.

4. A connected construction of a high-frequency package and a wiring board according to claim 3, wherein:

$$0 < D_p \leq \lambda_0/4(\epsilon_{r1}/2+\frac{1}{2})^{1/2}, \text{ and/or}$$

$$0 < D_b \leq \lambda_0/4(\epsilon_{r2}/2+\frac{1}{2})^{1/2},$$

where $D_p$ is the length of a portion of the second gap, the width of the portion being set to be larger in the longitudinal direction of the second signal line, being added to the joined portion on the high-frequency transmission line substrate, and $D_b$ is the length of a portion of the third gap, the width of the portion being set to be larger in the longitudinal direction of the third signal line, being added to the joined portion on the wiring board.

5. A connected construction of a high-frequency package and a wiring board according to claim 3, wherein the first ground is not formed in a prescribed region ranging from the end portion on the third-conductive-via connecting side of the first signal line to one side plane on the wiring-board connected side on the high-frequency transmission line substrate.

6. A connected construction of a high-frequency package and a wiring board according to claim 5, wherein the prescribed region includes at least a portion facing the second signal line between the end portion on the third-conductive-via connecting side of the first signal line and the one side plane on the wiring-board connected side.

7. A connected construction of a high-frequency package and a wiring board according to claim 5, wherein a lid for sealing the high-frequency package or a frame formed on a sealing portion is made of an insulating material when the prescribed region overlaps the sealing portion of the high-frequency package.

* * * * *